(12) United States Patent
Huang

(10) Patent No.: US 12,392,852 B2
(45) Date of Patent: Aug. 19, 2025

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventor: Wenhui Huang, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 525 days.

(21) Appl. No.: 17/811,575

(22) Filed: Jul. 8, 2022

(65) Prior Publication Data
US 2023/0019828 A1    Jan. 19, 2023

(30) Foreign Application Priority Data

Jul. 8, 2021   (CN) .......................... 202110772482.2

(51) Int. Cl.
| | | |
|---|---|---|
| G06T 7/00 | (2017.01) | |
| G01R 33/50 | (2006.01) | |
| G06T 5/50 | (2006.01) | |
| G06T 5/92 | (2024.01) | |

(52) U.S. Cl.
CPC ............... *G01R 33/50* (2013.01); *G06T 5/50* (2013.01); *G06T 5/92* (2024.01); *G06T 7/0014* (2013.01); *G06T 2207/10016* (2013.01); *G06T 2207/10088* (2013.01); *G06T 2207/30168* (2013.01)

(58) Field of Classification Search
CPC .. G01R 33/246; G01R 33/5659; G01R 33/44; G01R 33/443; G01R 33/48; G01R 33/50; G01R 33/5608; G01R 33/5613; G01R 33/56572; G01R 33/56563; A61B 5/055; A61B 2576/00; A61B 5/0037; A61B 5/0263; G06T 2207/10088; G06T 2207/30168; G06T 7/0014
See application file for complete search history.

(56) References Cited

U.S. PATENT DOCUMENTS

| | | | |
|---|---|---|---|
| 9,316,707 B2 | 4/2016 | Khalighi et al. | |
| 2009/0224756 A1* | 9/2009 | Machida | ............ G01R 33/3415 324/300 |
| 2009/0322331 A1* | 12/2009 | Buracas | ............ G01R 33/5613 324/309 |

(Continued)

OTHER PUBLICATIONS

Balezeau, Fabien, et al. "Mapping of low flip angles in magnetic resonance." Physics in Medicine & Biology 56.20 (2011): 6635.*

*Primary Examiner* — Li Liu
(74) *Attorney, Agent, or Firm* — METIS IP LLC

(57) ABSTRACT

A method for determining a sensitivity distribution of magnetic resonance (MR) receiving coils may include obtaining a reference image of a region of interest (ROI) of a subject. Contrast information between at least two types of tissues of the ROI may be weakened in the reference image. The method may also include determining, based on the reference image, a preliminary radio frequency (RF) field map corresponding to the ROI. The method may also include obtaining a transmitting field map corresponding to the ROI. The method may also include determining, based on the preliminary RF field map and the transmitting map, a sensitivity distribution of MR receiving coils corresponding to the ROI.

20 Claims, 13 Drawing Sheets

(56) References Cited

U.S. PATENT DOCUMENTS

| | | | |
|---|---|---|---|
| 2010/0239151 A1* | 9/2010 | Dannels | G01R 33/243 |
| | | | 382/131 |
| 2012/0032677 A1* | 2/2012 | Dannels | G01R 33/5659 |
| | | | 324/309 |
| 2015/0108984 A1* | 4/2015 | Pfeuffer | G01R 33/3852 |
| | | | 324/322 |
| 2015/0185301 A1* | 7/2015 | Hsu | G01R 33/4833 |
| | | | 324/322 |
| 2019/0128979 A1* | 5/2019 | Akita | G01R 33/546 |
| 2021/0018583 A1* | 1/2021 | Gui | G01R 33/58 |
| 2023/0148894 A1* | 5/2023 | Weiss | A61B 5/055 |
| | | | 600/410 |

* cited by examiner 1300-1

1300-2

1300-3

1400-1

1410

1400-2

1400-3

1420

SYSTEMS AND METHODS FOR MAGNETIC RESONANCE IMAGING

CROSS-REFERENCE TO RELATED APPLICATIONS

This application claims priority of CN Application No. 202110772482.2, filed on Jul. 8, 2021, the entire contents of which are hereby incorporated by reference.

TECHNICAL FIELD

The present disclosure relates to the field of magnetic resonance imaging (MRI), in particular, to methods and systems for performing uniformity correcting of radio frequency (RF) field on an image.

BACKGROUND

In a magnetic resonance (MR) system, the distribution of radio frequency (RF) field is uneven. Especially in high magnetic field MR, with the enhancement of MR field intensity, the problem of non-uniformity of RF field becomes more and more serious. The non-uniformity of RF field makes brightness or contrast information of an image acquired by the MR system uneven, which affects the re-processing analysis of the image, such as diagnosis with the image by a doctor, and image segmentation. Therefore, it is desirable to provide methods and systems for performing uniformity correcting of RF field on an image.

SUMMARY

According to an aspect of the present disclosure, a system for determining a sensitivity distribution of magnetic resonance (MR) receiving coils may include one or more storage devices and one or more processors configured to communicate with the one or more storage devices. The one or more storage devices may include a set of instructions. When the one or more processors executing the set of instructions, the one or more processors may be directed to perform one or more of the following operations. The one or more processors may obtain a reference image of a region of interest (ROI) of a subject. Contrast information between at least two types of tissues of the ROI may be weakened in the reference image. The one or more processors may determine, based on the reference image, a preliminary radio frequency (RF) field map corresponding to the ROI. The one or more processors may obtain a transmitting field map corresponding to the ROI. The one or more processors may determine, based on the preliminary RF field map and the transmitting map, a sensitivity distribution of MR receiving coils corresponding to the ROI.

In some embodiments, to obtain the reference image of the ROI of the subject, the one or more processors may acquire the reference image based on a first acquisition sequence.

In some embodiments, the reference image may include an unweighted image of the ROI in which an effect caused by T1 and T2 of the at least two types of tissues on the contrast information is weakened.

In some embodiments, the reference image may include a proton density suppression image of the ROI in which an effects caused by proton density of the at least two types of tissues on the contrast information is adjusted.

In some embodiments, the first acquisition sequence may be a three-dimensional (3D) gradient echo sequence.

In some embodiments, in the first acquisition sequence, a flip angle of an excitation RF pulse may be within 1°-15°; an echo time (TE) of the at least two types of tissues may be in phase; and a repetition time (TR) may be less than T1 values and T2 values of the at least two types of tissues.

In some embodiments, to determine, based on the reference image, the preliminary RF field map corresponding to the ROI, the one or more processors may extract low frequency information of the reference image. The one or more processors may determine the preliminary RF field map based on the low frequency information.

In some embodiments, to obtain the transmitting field map corresponding to the ROI, the one or more processors may acquire at least two transmitting field magnitude images based on a second acquisition sequence. The one or more processors may determine the transmitting field map based on the at least two transmitting field magnitude images.

In some embodiments, the one or more processors may correct an MR image of the ROI based on the transmitting field map and the sensitivity distribution.

According to another aspect of the present disclosure, a method for determining a sensitivity distribution of magnetic resonance (MR) receiving coils may include one or more of the following operations. One or more processors may obtain a reference image of a region of interest (ROI) of a subject. Contrast information between at least two types of tissues of the ROI may be weakened in the reference image. The one or more processors may determine, based on the reference image, a preliminary radio frequency (RF) field map corresponding to the ROI. The one or more processors may obtain a transmitting field map corresponding to the ROI. The one or more processors may determine, based on the preliminary RF field map and the transmitting map, a sensitivity distribution of MR receiving coils corresponding to the ROI.

According to yet another aspect of the present disclosure, a system for determining a sensitivity distribution of magnetic resonance (MR) receiving coils may include a reference image obtaining module configured to obtain a reference image of a region of interest (ROI) of a subject. Contrast information between at least two types of tissues of the ROI may be weakened in the reference image. The system may also include a radio frequency (RF) field determination module configured to determine, based on the reference image, a preliminary radio frequency (RF) field map corresponding to the ROI. The system may also include a sensitivity distribution determination module configured to obtain a transmitting field map corresponding to the ROI, and determine, based on the preliminary RF field map and the transmitting map, a sensitivity distribution of MR receiving coils corresponding to the ROI.

According to yet another aspect of the present disclosure, a non-transitory computer readable medium may comprise at least one set of instructions. The at least one set of instructions may be executed by one or more processors of a computer server. The one or more processors may obtain a reference image of a region of interest (ROI) of a subject. Contrast information between at least two types of tissues of the ROI may be weakened in the reference image. The one or more processors may determine, based on the reference image, a preliminary radio frequency (RF) field map corresponding to the ROI. The one or more processors may obtain a transmitting field map corresponding to the ROI. The one or more processors may determine, based on the preliminary RF field map and the transmitting map, a sensitivity distribution of MR receiving coils corresponding to the ROI.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
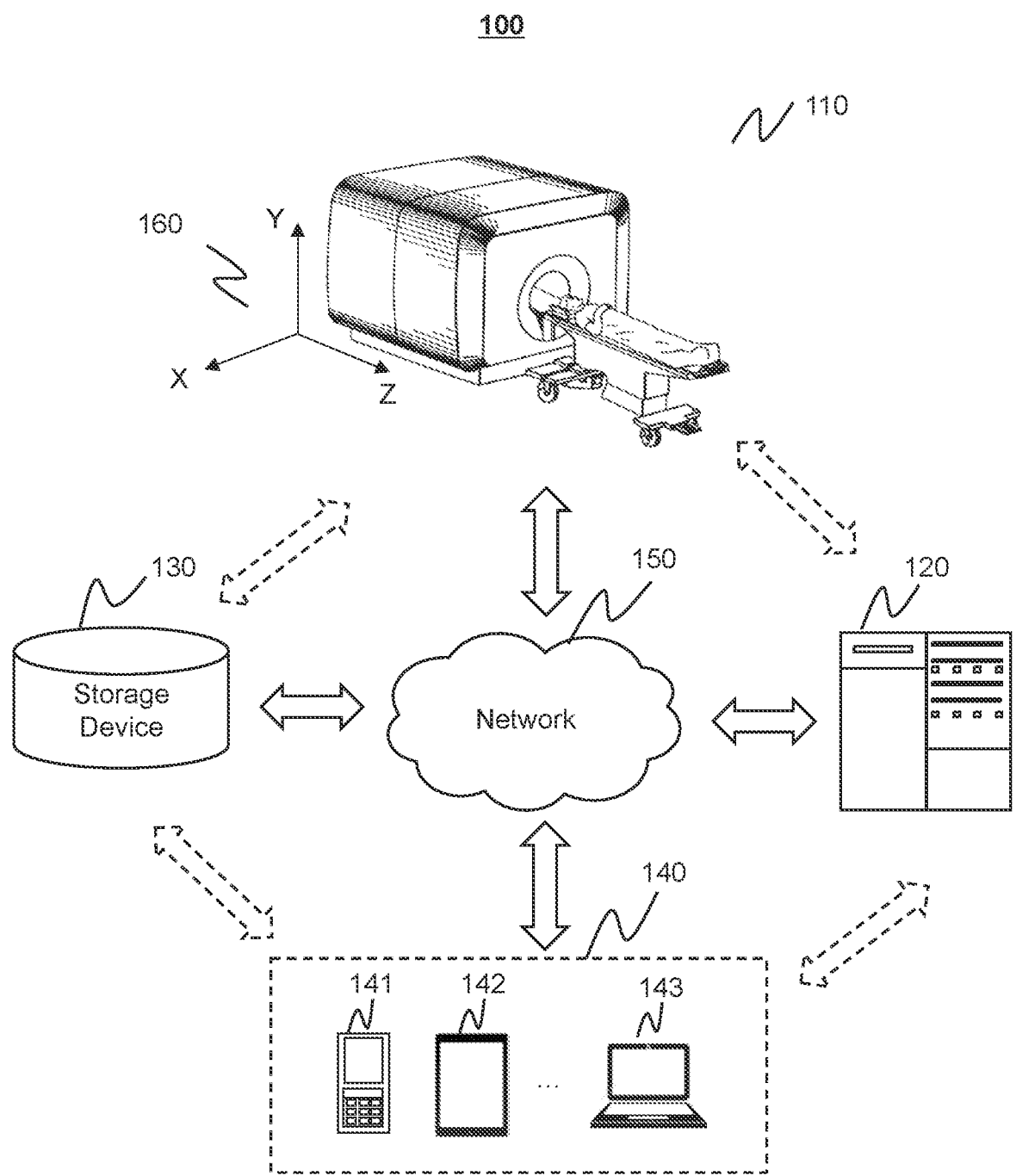
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Also, the term "exemplary" is intended to refer to an example or illustration.

It will be understood that the terms "system," "engine," "unit," "module," and/or "block" used herein are one method to distinguish different components, elements, parts, sections or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

The term "pixel" and "voxel" in the present disclosure are used interchangeably to refer to an element in an image. The term "image" in the present disclosure is used to refer to images of various forms, including a 2-dimensional image, a 3-dimensional image, a 4-dimensional image, etc.

Spatial and functional relationships between elements are described using various terms, including "connected," "attached," and "mounted." Unless explicitly described as being "direct," when a relationship between first and second elements is described in the present disclosure, that relationship includes a direct relationship where no other intervening elements are present between the first and second elements, and also an indirect relationship where one or more intervening elements are present (either spatially or functionally) between the first and second elements. In contrast, when an element is referred to as being "directly" connected, attached, or positioned to another element, there are no intervening elements present. Other words used to describe the relationship between elements should be interpreted in a like fashion (e.g., "between," versus "directly between," "adjacent," versus "directly adjacent," etc.).

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in inverted order, or simultaneously. Moreover, one or more other operations may be added to the flowcharts. One or more operations may be removed from the flowcharts.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

In a magnetic resonance (MR) system, the distribution of radio frequency (RF) field is uneven. Especially in high magnetic field MR, with the enhancement of MR field intensity, the problem of non-uniformity of RF field becomes more and more serious. The RF field may include a transmitting field corresponding to an RF transmitting coil and a receiving field corresponding to an RF receiving coil of the MR system. The non-uniformity of RF field makes brightness or contrast information of an image acquired by the MR system uneven, which affects the image re-processing analysis, such as diagnosis with the image by a doctor, and image segmentation. Therefore, the uniformity correction of RF field is particularly important. In the high magnetic field, the difficulty of uniformity correction increases. In the high magnetic field, in addition to characteristics of different types of tissues, uneven distribution information of the transmitting field and uneven distribution information of the receiving field also make contribution to brightness information and/or contrast information of an image acquired by the receiving coil of the MR system. To correct the brightness uniformity of an image, the non-uniformity of the transmitting field and the non-uniformity of the receiving field may need to be corrected separately to the image.

For example, in the MR system, the distribution of the RF field may become non-uniform due to variations in the distance from the RF coil (e.g., the transmitting coil and/or the receiving coil) at different locations in a region to be scanned. The uneven distribution of the RF field may reduce the brightness uniformity of an image acquired by MR system, and then the image re-processing analysis, such as diagnosis with the image by a doctor, and image segmentation may be affected. Moreover, with the increase of static magnetic field intensity, the unevenness degree of the RF field may increase, especially in the high magnetic field (e.g., $B_0 \geq 3T$), the unevenness of the RF field may be more obvious.

A common method for RF field uniformity correction includes obtaining receiving sensitivity information of coils to be corrected by first pre-scanning a volume transmit coil (VTC) image with the same imaging expectation as a reference image based on an assumption that the VTC has a relatively uniform sensitivity distribution, and performing a uniformity correction on the image to be corrected. The method is based on the assumption that the VTC image is relatively uniform, and the correction effect in low magnetic field meets the actual needs. Another common method is extracting sensitivity distribution of coils based on image information.

The present disclosure provides a method for determining a sensitivity distribution of an MR receiving coil and a method for correcting uniformity of RF field on an image. A reference image may be obtained first, wherein contrast information between at least two types of tissues of a region of interest (ROI) may be weakened in the reference image. Based on the reference image, a preliminary radio frequency (RF) field map corresponding to the ROI may be determined. A transmitting field map corresponding to the ROI may be determined, and a sensitivity distribution of the MR receiving coil corresponding to the ROI may be determined based on the preliminary RF field map and the transmitting map. Thus, the sensitivity distribution of the MR receiving coil and the transmitting field map of the transmitting field may be determined respectively in the present disclosure. Moreover, according to a method for correcting uniformity of RF field on an image to be corrected provided by some embodiments of the present disclosure, the correction of the receiving field non-uniformity and the transmitting field non-uniformity may be performed independently on the image to be corrected, so that multiple correction of the same ROI of a subject may be implemented, thereby realizing RF field uniformity correction of the MR image under high field intensity.

In the method for determining a sensitivity distribution of an MR receiving coil provided by the present disclosure, the correction effect is good in the RF field with high field intensity. In addition, the receiving field non-uniformity and the transmitting field non-uniformity may be determined respectively, and the transmitting field non-uniformity and the receiving field non-uniformity may be corrected separately. For example, the method for determining a sensitivity distribution of an MR receiving coil provided in the present disclosure may be applied to an MR system, especially to a MR system with high field intensities such as 5 Tesla and 7 Tesla. When correcting an image of a certain part of a patient, the method may determine both the receiving field non-uniformity information and the transmitting field non-uniformity information of the RF field. Then, the image may be corrected based on the receiving field non-uniformity information (e.g., a sensitivity distribution of the MR receiving coil in some embodiments of the present disclosure) and the transmitting field non-uniformity information (e.g., a transmitting field map of the transmitting field in some embodiments of the present disclosure).

FIG. 1 is a schematic diagram illustrating an exemplary MRI system according to some embodiments of the present disclosure. As illustrated, an MRI system 100 may include an MRI device 110, a processing device 120, a storage device 130, a terminal 140, and a network 150. The components of the MRI system 100 may be connected in one or more of various ways. Merely by way of example, as illustrated in FIG. 1, the MRI device 110 may be connected to the processing device 120 directly as indicated by the bi-directional arrow in dotted lines linking the MRI device 110 and the processing device 120, or through the network 150. As another example, the storage device 130 may be connected to the MRI device 110 directly as indicated by the bi-directional arrow in dotted lines linking the MRI device 110 and the storage device 130, or through the network 150. As still another example, the terminal 140 may be connected to the processing device 120 directly as indicated by the bi-directional arrow in dotted lines linking the terminal 140 and the processing device 120, or through the network 150.

The MRI device 110 may be configured to scan a subject (or a part of the subject) to acquire image data, such as echo signals (also referred to as magnetic resonance (MR) data or MR signals) associated with the subject. For example, the MRI device 110 may detect a plurality of echo signals by applying an MRI pulse sequence on the subject. In some embodiments, the MRI device 110 may include, for example, a main magnet, a gradient coil (or also referred to as a spatial encoding coil), a radio frequency (RF) coil, etc., as described in connection with FIG. 2. In some embodiments, the MRI device 110 may be a permanent magnet MRI scanner, a superconducting electromagnet MRI scanner, a resistive electromagnet MRI scanner, etc., according to types of the main magnet. In some embodiments, the MRI device 110 may be a high-field MRI scanner, a mid-field MRI scanner, a low-field MRI scanner, etc., according to the intensity of the magnetic field.

The subject scanned by the MRI device 110 may be biological or non-biological. For example, the subject may include a patient, a man-made object, etc. As another example, the subject may include a specific portion, an organ, tissue, and/or a physical point of the patient. Merely by way of example, the subject may include the head, the brain, the neck, a body, a shoulder, an arm, the thorax, the heart, the stomach, a blood vessel, soft tissue, a knee, a foot, or the like, or any combination thereof.

For illustration purposes, a coordinate system 160 including an X-axis, a Y-axis, and a Z-axis may be provided in FIG. 1. The X-axis and the Z axis shown in FIG. 1 may be horizontal, and the Y-axis may be vertical. As illustrated, the positive X direction along the X-axis may be from the right side to the left side of the MRI device 110 seen from the direction facing the front of the MRI device 110; the positive Y direction along the Y-axis shown in FIG. 1 may be from the lower part to the upper part of the MRI device 110; the positive Z direction along the Z-axis shown in FIG. 1 may refer to a direction in which the subject is moved out of a detection region (or referred to as a bore) of the MRI device 110.

In some embodiments, the MRI device 110 may be directed to select an anatomical region (e.g., a slice or a volume) of the subject along a slice selection direction and scan the anatomical region to acquire a plurality of echo signals from the anatomical region. During the scan, spatial encoding within the anatomical region may be implemented by spatial encoding coils (e.g., an X coil, a Y coil, a Z coil) along a frequency encoding direction, a phase encoding direction, and a slice selection direction. The echo signals may be sampled and the corresponding sampled data may be stored into a k-space matrix for image reconstruction. For illustration purposes, the slice selection direction herein may correspond to the Z direction defined by the coordinate system 160 and a Kz direction in k-space; the phase encoding direction may correspond to the Y direction defined by the coordinate system 160 and a Ky direction in k-space; and the frequency encoding direction (also referred to as readout direction) may correspond to the X direction defined by the coordinate system 160 and a Kx direction in k-space. It should be noted that the slice selection direction, the phase encoding direction, and the frequency encoding direction may be modified according to actual needs, and the modification may do not depart the scope of the present disclosure. More description of the MRI device 110 may be found elsewhere in the present disclosure. See, e.g., FIG. 2 and the description thereof.

The processing device 120 may process data and/or information obtained from the MRI device 110, the storage device 130, and/or the terminal(s) 140. For example, the processing device 120 may obtain a reference image of a region of interest (ROI) of a subject. Contrast information between at least two types of tissues of the ROI may be weakened in the reference image. The processing device 120 may determine, based on the reference image, a preliminary radio frequency (RF) field map corresponding to the ROI. The processing device 120 may obtain a transmitting field map corresponding to the ROI. The processing device 120 may determine, based on the preliminary RF field map and the transmitting map, a sensitivity distribution of MR receiving coils corresponding to the ROI. The processing device 120 may correct an MR image of the ROI based on the transmitting field map and the sensitivity distribution.

In some embodiments, the processing device 120 may be a single server or a server group. The server group may be centralized or distributed. In some embodiments, the processing device 120 may be local or remote. For example, the processing device 120 may access information and/or data from the MRI device 110, the storage device 130, and/or the terminal(s) 140 via the network 150. As another example, the processing device 120 may be directly connected to the MRI device 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be part of the terminal 140. In some embodiments, the processing device 120 may be part of the MRI device 110.

The storage device 130 may store data, instructions, and/or any other information. In some embodiments, the storage device 130 may store data obtained from the MRI device 110, the processing device 120, and/or the terminal(s) 140. The data may include image data acquired by the processing device 120, algorithms and/or models for processing the image data, etc. For example, the storage device 130 may store the reference image of the ROI of the subject. As another example, the storage device 130 may store the transmitting field map corresponding to the ROI. As still another example, the storage device 130 may store the sensitivity distribution of MR receiving coils corresponding to the ROI. As still another example, the storage device 130 may store the corrected image of the ROI. In some embodiments, the storage device 130 may store data and/or instructions that the processing device 120 and/or the terminal 140 may execute or use to perform exemplary methods described in the present disclosure. In some embodiments, the storage device 130 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the MRI system 100 (e.g., the processing device 120, the terminal(s) 140). One or more components in the MRI system 100 may access the data or instructions stored in the storage device 130 via the network 150. In some embodiments, the storage device 130 may be integrated into the MRI device 110 or the processing device 120.

The terminal(s) 140 may be connected to and/or communicate with the MRI device 110, the processing device 120, and/or the storage device 130. In some embodiments, the terminal 140 may include a mobile device 141, a tablet computer 142, a laptop computer 143, or the like, or any combination thereof. For example, the mobile device 141 may include a mobile phone, a personal digital assistant (PDA), a gaming device, a navigation device, a point of sale (POS) device, a laptop, a tablet computer, a desktop, or the like, or any combination thereof. In some embodiments, the terminal 140 may include an input device, an output device, etc. The input device may include alphanumeric and other keys that may be input via a keyboard, a touchscreen (for example, with haptics or tactile feedback), a speech input, an eye tracking input, a brain monitoring system, or any other comparable input mechanism. Other types of the input device may include a cursor control device, such as a mouse, a trackball, or cursor direction keys, etc. The output device may include a display, a printer, or the like, or any combination thereof.

The network 150 may include any suitable network that can facilitate the exchange of information and/or data for the MRI system 100. In some embodiments, one or more components of the MRI system 100 (e.g., the MRI device 110, the processing device 120, the storage device 130, the terminal(s) 140, etc.) may communicate information and/or data with one or more other components of the MRI system 100 via the network 150. For example, the processing device 120 may obtain k-space data from the MRI device 110 via the network 150. As another example, the processing device 120 and/or the terminal 140 may obtain information stored in the storage device 130 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network (VPN), a satellite network, a telephone network, routers, hubs, witches, server computers, and/or any combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. However, those variations and modifications do not depart the scope of the present disclosure. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MRI device 110. As another example, a component of the MRI system 100 may be replaced by another component that can implement the functions of the component. As still another example, the processing device 120 and the terminal 140 may be integrated into a single device.

Figure 2:
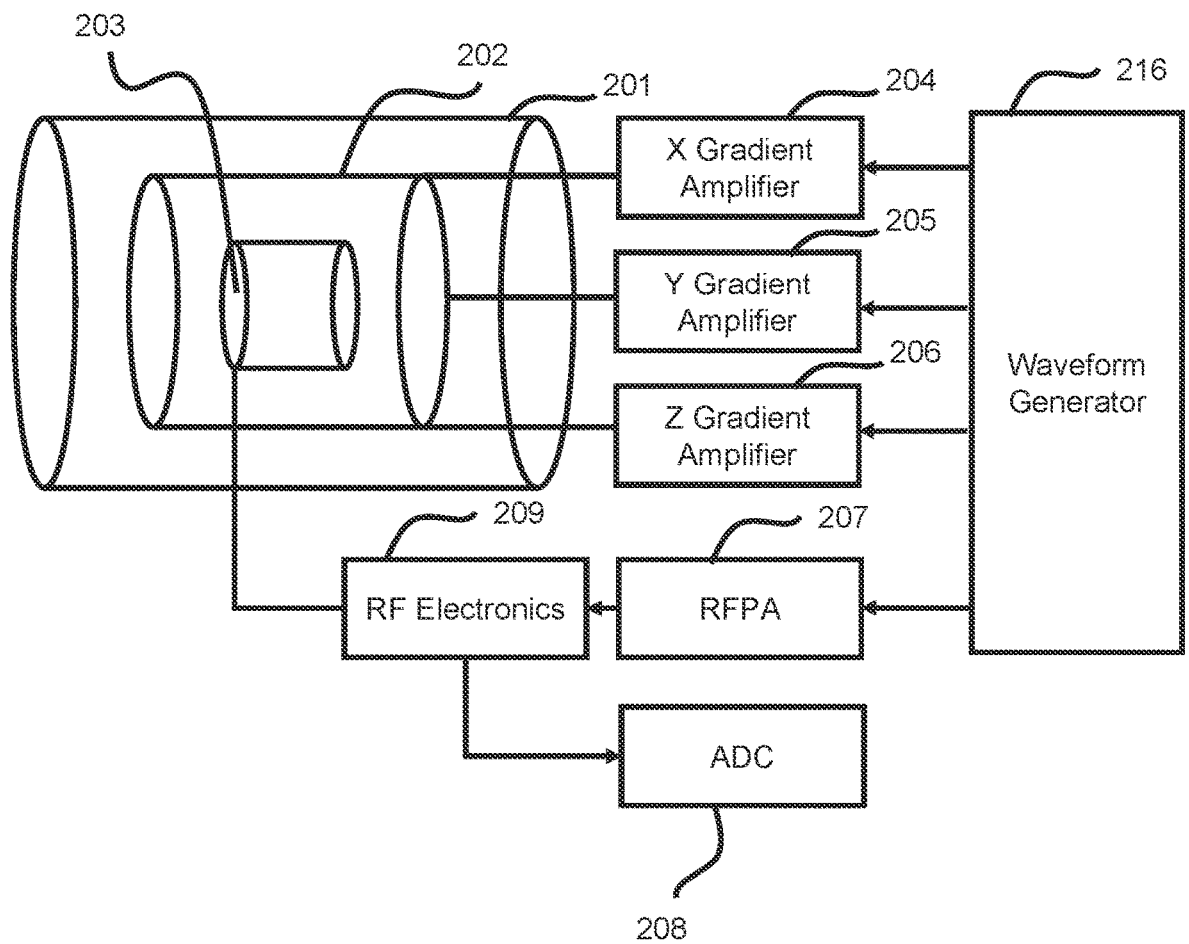
FIG. 2 is a schematic diagram illustrating an exemplary MRI device according to some embodiments of the present disclosure.

FIG. 2 is a schematic diagram illustrating an exemplary MRI device 110 according to some embodiments of the present disclosure. As illustrated, a main magnet 201 may generate a first magnetic field (or referred to as a main magnetic field) that may be applied to an object (also referred to as a subject) positioned inside the first magnetic field. The main magnet 201 may include a resistive magnet or a superconductive magnet that both need a power supply (not shown in FIG. 2) for operation. Alternatively, the main magnet 201 may include a permanent magnet. The main magnet 201 may form a detection region and surround, along the Z direction, the object that is moved into or positioned within the detection region.

Gradient coils 202 may be located inside the main magnet 201. For example, the gradient coils 202 may be located in the detection region. The gradient coils 202 may surround, along the Z direction, the object that is moved into or positioned within the detection region. The gradient coils 202 may be surrounded by the main magnet 201 around the Z direction, and be closer to the object than the main magnet 201. The gradient coils 202 may generate a second magnetic field (or referred to as a gradient field, including gradient fields Gx, Gy, and Gz). The second magnetic field may be superimposed on the main magnetic field generated by the main magnet 201 and distort the main magnetic field so that the magnetic orientations of the protons of an object may vary as a function of their positions inside the gradient field, thereby encoding spatial information into MR signals generated by the region of the object being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). The three sets of coils may generate three different magnetic fields that are used for position encoding. The gradient coils 202 may allow spatial encoding of MR signals for image reconstruction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. For example, the RF coils 203 may be located in the detection region. The RF coils 203 may surround, along the Z direction, the object that is moved into or positioned within the detection region. The RF coils 203 may be surrounded by the main magnet 201 and/or the gradient coils 202 around the Z direction, and be closer to the object than the gradient coils 202. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters (e.g., RF transmitting coils), the RF coils 203 may generate RF signals that provide a third magnetic field (e.g., an RF transmitting field) that is utilized to generate MR signals related to the region of the object being imaged. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers (e.g., RF receiving coils), the RF coils may be responsible for detecting MR signals (e.g., echoes). After excitation, the MR signals generated by the object may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals then may be sent to the processing device 140 for sampling.

In some embodiments, the main magnet coil 201, the gradient coils 202, and the RF coils 203 may be circumferentially positioned with respect to the object around the Z direction. It is understood by those skilled in the art that the main magnet 201, the gradient coils 202, and the RF coils 203 may be situated in a variety of configurations around the object.

Figure 3:
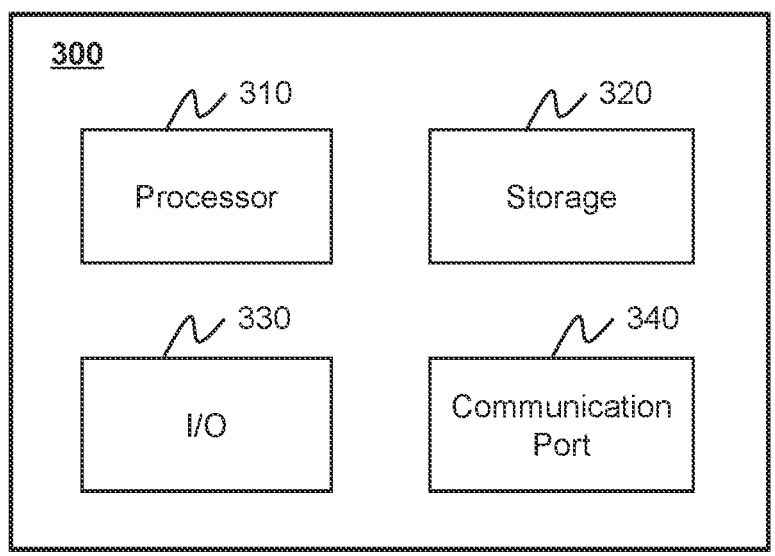
FIG. 3 is a schematic diagram illustrating exemplary hardware and/or software components of a computing device according to some embodiments of the present disclosure.

FIG. 3 is a schematic diagram illustrating exemplary hardware and/or software components of a computing device 300 according to some embodiments of the present disclosure. In some embodiments, one or more components of the MRI system 100 may be implemented on one or more components of the computing device 300. Merely by way of example, the processing device 120 and/or the terminal(s) 140 may be implemented one or more components of the computing device 300, respectively.

As illustrated in FIG. 3, the computing device 300 may include a processor 310, a storage device 320, an input/output (I/O) 330, and a communication port 340. The processor 310 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 310 may process image data of a subject obtained from the MRI device 110, the storage device 130, terminal(s) 140, and/or any other component of the MRI system 100.

In some embodiments, the processor 310 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or a combinations thereof.

Merely for illustration, only one processor is described in the computing device 300. However, it should be noted that the computing device 300 in the present disclosure may also include multiple processors. Thus operations and/or method steps that are performed by one processor as described in the present disclosure may also be jointly or separately performed by the multiple processors. For example, if in the present disclosure the processor of the computing device 300 executes both operation A and operation B, it should be understood that operation A and operation B may also be performed by two or more different processors jointly or separately in the computing device 300 (e.g., a first processor executes operation A and a second processor executes operation B, or the first and second processors jointly execute operations A and B).

The storage device 320 may store data/information obtained from the MRI device 110, the storage device 130, the terminal(s) 140, and/or any other component of the MRI system 100. In some embodiments, the storage device 320 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random-access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 320 may store one or more programs and/or instructions to perform exemplary methods described in the present disclosure.

The I/O 330 may input and/or output signals, data, information, etc. In some embodiments, the I/O 330 may enable a user interaction with the computing device 300 (e.g., the processing device 120). In some embodiments, the I/O 330 may include an input device and an output device. Examples of the input device may include a keyboard, a mouse, a touch screen, a microphone, or the like, or any combination thereof. Examples of the output device may include a display device, a loudspeaker, a printer, a projector, or the like, or any combination thereof. Examples of the display device may include a liquid crystal display (LCD), a light-emitting diode (LED)-based display, a flat panel display, a curved screen, a television device, a cathode ray tube (CRT), a touch screen, or the like, or any combination thereof.

The communication port 340 may be connected to a network (e.g., the network 150) to facilitate data communications. The communication port 340 may establish connections between the computing device 300 (e.g., the processing device 120) and one or more components of the MRI system 100 (e.g., the MRI device 110, the storage device 130, and/or the terminal(s) 140). The connection may be a wired connection, a wireless connection, any other communication connection that can enable data transmission and/or reception, and/or a combination of these connections. The wired connection may include, for example, an electrical cable, an optical cable, a telephone wire, or the like, or a combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or any combination thereof. In some embodiments, the communication port 340 may be and/or include a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
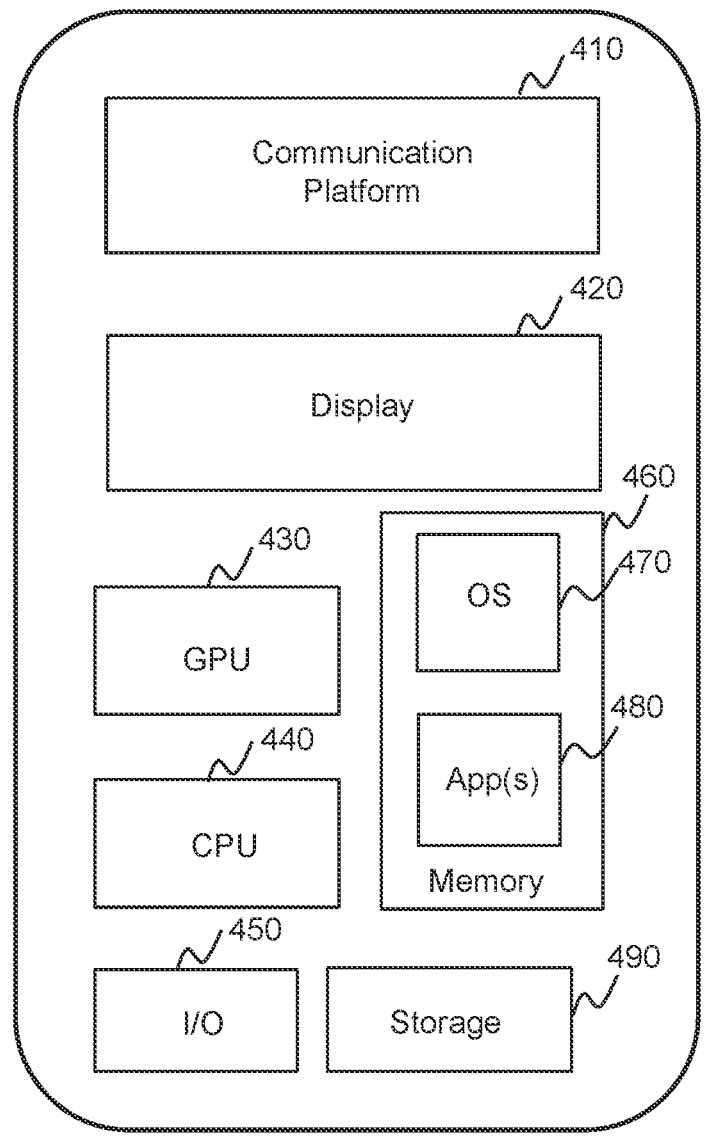
FIG. 4 is a schematic diagram illustrating exemplary hardware and/or software components of a mobile device may be implemented according to some embodiments of the present disclosure.

FIG. 4 is a schematic diagram illustrating exemplary hardware and/or software components of a mobile device 400 may be implemented according to some embodiments of the present disclosure. In some embodiments, one or more components of the MRI system 100 may be implemented on one or more components of the mobile device 400. Merely by way of example, the terminal 140 may be implemented on one or more components of the mobile device 400.

As illustrated in FIG. 4, the mobile device 400 may include a communication platform 410, a display 420, a graphics processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS™, Android™, Windows Phone™, etc.) and one or more applications 480 may be loaded into the memory 460 from the storage 490 in order to be executed by the CPU 440. The applications 480 may include a browser or any other suitable mobile apps for receiving and rendering information relating to the MRI system 100. User interactions with the information stream may be achieved via the I/O 450 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal. A computer may also act as a server if appropriately programmed.

Figure 5:
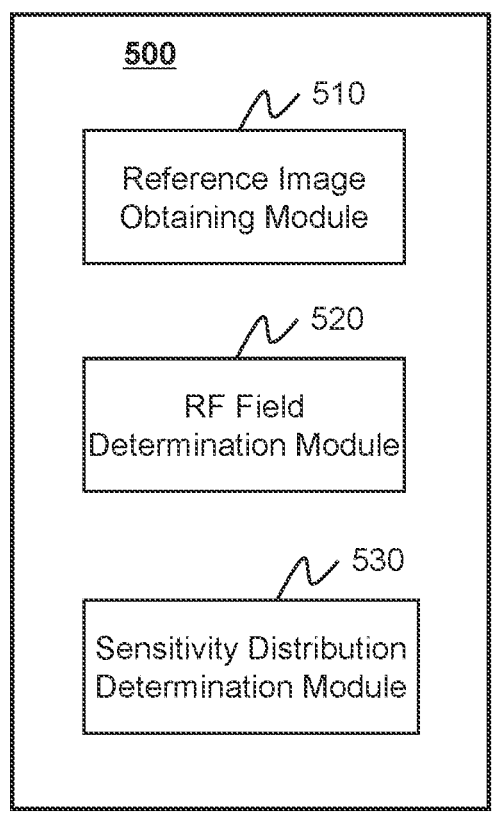
FIG. 5 is a schematic diagram illustrating an exemplary processing device according to some embodiments of the present disclosure.

FIG. 5 is a schematic diagram illustrating an exemplary processing device 500 according to some embodiments of the present disclosure. In some embodiments, the processing device 500 may include a reference image obtaining module 510, an RF field determination module 520, and a sensitivity distribution determination module 530. In some embodiments, the processing device 500 may be implemented on the processing device 120. For example, the modules may be hardware circuits of all or part of the processing device 120. The modules may also be implemented as an application or set of instructions read and executed by the processing device 120. Further, the modules may be any combination of the hardware circuits and the application/instructions. For example, the modules may be part of the processing device 120 when the processing device 120 is executing the application/set of instructions.

The reference image obtaining module 510 may be configured to obtain a reference image of a region of interest (ROI) of a subject. Contrast information between at least two types of tissues of the ROI may be weakened in the reference image.

The radio frequency (RF) field determination module may be configured to determine, based on the reference image, a preliminary radio frequency (RF) field map corresponding to the ROI.

The sensitivity distribution determination module may be configured to obtain a transmitting field map corresponding to the ROI, and determine, based on the preliminary RF field map and the transmitting map, a sensitivity distribution of MR receiving coils corresponding to the ROI.

In some embodiments, the reference image obtaining module 510 may include a first scanning unit configured to obtain an unweighted image of the ROI based on a first acquisition sequence and designate the unweighted image as the reference image.

In some embodiments, the reference image obtaining module 510 may include a second scanning unit configured to obtain a proton density suppression image of the ROI based on a first acquisition sequence and designate the proton density suppression image as the reference image.

In some embodiments, the RF field determination module 520 may be configured to obtain low frequency information of the reference image, and determine a preliminary RF field map corresponding to the ROI based on the low frequency information.

In some embodiments, the reference image obtaining module 510 may include an acquisition sequence determination unit and a pre-scan unit. The acquisition sequence determination unit may be configured to determine a first acquisition sequence corresponding to the ROI based on a sequence information list, wherein the sequence information list may include a plurality of acquisition sequences corresponding to different ROIs. The pre-scan unit may be configured to perform a first pre-scan on the ROI based on the first acquisition sequence to obtain the reference image.

In some embodiments, the sensitivity distribution determination module 530 may include a transmitting field determination unit and a receiving field determination unit. The transmitting field determination unit may be configured to determine actual transmitting field information of the ROI based on a second acquisition sequence and designate the actual transmitting field information as the transmitting field map corresponding to the ROI. The receiving field determination unit may be configured to determine actual receiving field information of the ROI based on the preliminary RF field map and the transmitting field map, and designate the actual receiving field information as the sensitivity distribution of the MR receiving coil corresponding to the ROI.

In some embodiments, the transmitting field determination unit may be configured to obtain at least two transmitting field magnitude images of the ROI based on the second acquisition sequence, and determine the transmitting field map (the actual transmitting field information) corresponding to the ROI based on the at least two transmitting field magnitude images.

In some embodiments, the processing device 500 may further include a correction module configured to obtain an image to be corrected of the ROI, and obtain a target image of the ROI by performing, based on the transmitting field map and the sensitivity distribution of the MR receiving coil, RF field correction on the image to be corrected.

It should be noted that the above description of the processing device 500 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. Two or more of the modules may be combined as a single module, and any one of the modules may be divided into two or more units.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 500 may further include a storage module (not shown in FIG. 5). The storage module may be configured to store data generated during any process performed by any component of in the processing device 500. As another example, each of the components of the processing device 500 may include a storage device. Additionally or alternatively, the components of the processing device 500 may share a common storage device.

Figure 6:
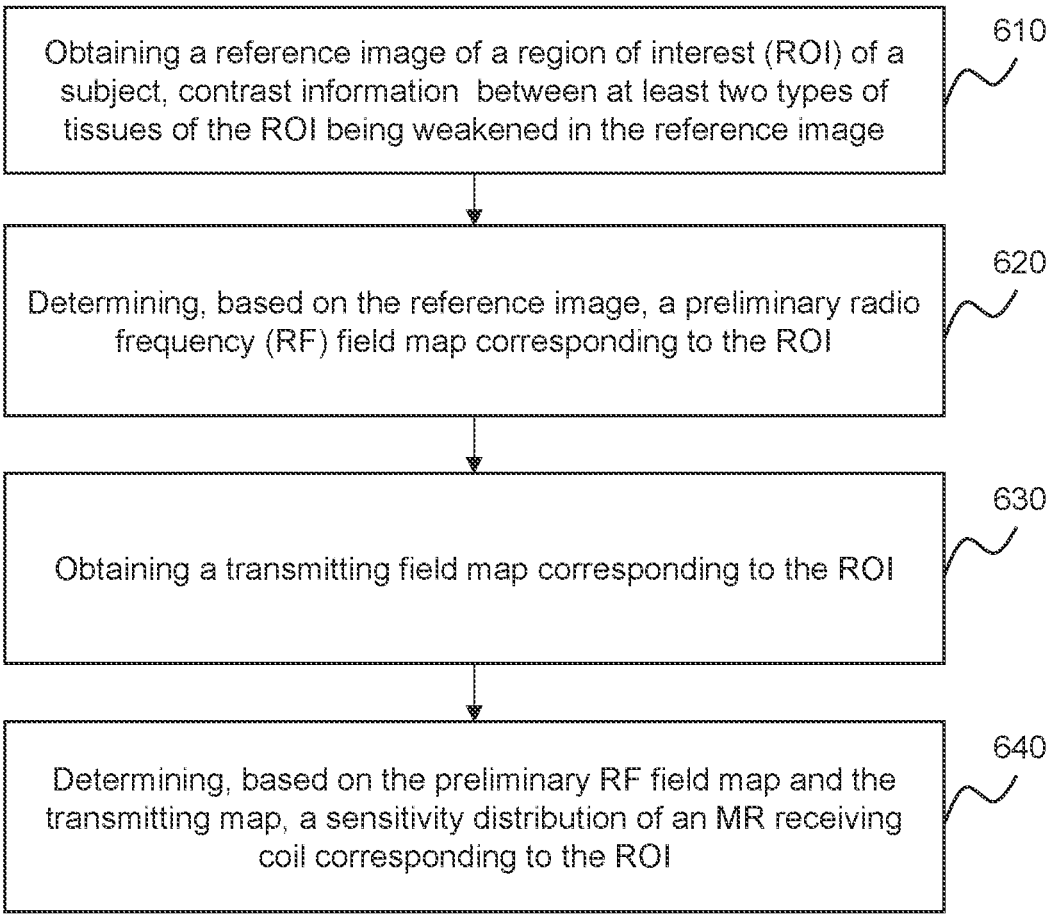
FIG. 6 is a flowchart illustrating an exemplary method for determining a sensitivity distribution of a magnetic resonance (MR) receiving coil according to some embodiments of the present disclosure.

FIG. 6 is a flowchart illustrating an exemplary process for determining a sensitivity distribution of an MR receiving coil according to some embodiments of the present disclosure. In some embodiments, the process 600 may be implemented in the MRI system 100 illustrated in FIG. 1. For example, the process 600 may be stored in the storage device 130 and/or the storage (e.g., the storage 320, the storage 490) as a form of instructions, and invoked and/or executed by the processing device 120 (e.g., the processor 310 of the computing device 300 as illustrated in FIG. 3, the CPU 440 of the mobile device 400 as illustrated in FIG. 4). The operations of the illustrated process presented below are intended to be illustrative. In some embodiments, the process 600 may be accomplished with one or more additional operations not described, and/or without one or more of the operations discussed. Additionally, the order in which the operations of the process 600 as illustrated in FIG. 6 and described below is not intended to be limiting.

In 610, the processing device 120 (e.g., the reference image obtaining module 510) may obtain a reference image of a region of interest (ROI) of a subject. Contrast information between at least two types of tissues of the ROI may be weakened in the reference image.

The ROI of the subject may include a tissue or an organ. For example, the ROI may be head, chest, abdomen, neck, limbs, chest, ankle, or other large regions of the subject, as well as the breast, liver, heart, spleen, kidney, other organs, or tissues.

In some embodiments, the reference image may be obtained by performing a first pre-scan on the ROI based on a first acquisition sequence using an MRI device (e.g., the MRI device 110). The first pre-scan may be performed before or after acquiring an image to be corrected of the ROI. In some embodiments, the first acquisition sequence may be a sequence set in advance or set during the first pre-scan. In some embodiments, the first acquisition sequence may be obtained by setting one or more specific scanning parameters. In some embodiments, the one or more scanning parameters may include a field of view (FOV) of the MRI device 110, a matrix pixel of the reference image, a flip angle, an echo time, a repetition time, or the like, or any combination thereof. In some embodiments, the first acquisition sequence may include a three-dimensional (3D) sequence. In some embodiments, the first acquisition sequence may include a gradient echo sequence.

In some embodiments, the reference image may include an unweighted image. In some embodiments, the reference image may include a proton density suppression image. The detailed description for the unweighted image and the proton density suppression image may refer to the description of FIG. 7 and FIG. 8. In some embodiments, the reference image may be a two-dimensional (2D) image or a three-dimensional (3D) image.

In some embodiments, contrast information between at least two types of tissues of the ROI in the reference image may reflect a structure difference between the at least two types of tissues in the reference image. The contrast information between the at least two types of tissues may refer to a difference range (e.g., a ratio, a difference, etc.) between the maximum brightness and the minimum brightness of pixels or voxels in the at least two types of tissues in the reference image, or a difference range (e.g., a ratio, a difference, etc.) between the maximum gray value and the minimum gray value of pixels or voxels in the at least two types of tissues in the reference image.

A magnetic resonance imaging (MRI) system includes a main magnet (e.g., the main magnet 201) assembly for providing a strong uniform main magnetic field to align the individual magnetic moments of the H atoms within the patient's body. During this process, the H atoms oscillate around their magnetic poles at their characteristic Larmor frequency. If the tissue is subjected to an additional magnetic field, which is tuned to the Larmor frequency, the H atoms absorb additional energy, which rotates the net aligned moment of the H atoms. The additional magnetic field may be provided by an RF excitation signal (e.g., the RF signal generated by a transmitting coil of the RF coils 203). When the additional magnetic field is removed, the magnetic moments of the H atoms rotate back into alignment with the main magnetic field thereby emitting an MR signal. The MR signal is received by a receiving coil of the RF coils 203 and processed to form an MR image. An intensity of the MR signal corresponding to different types of tissues may be related to characteristics of different types of tissues, such as proton density, T1, and T2 of different types of tissues. The proton density may refer to a count of protons in unit tissue. T1 relaxation may be the process by which the net magnetization grows/returns to its initial maximum value parallel to the main magnetic field. T1 may be the time constant for regrowth of longitudinal magnetization (e.g., along the main magnetic field). T2 relaxation may be the process by which the transverse components of magnetization decay or dephase. T2 may be the time constant for decay/dephasing of transverse magnetization.

In some embodiments, the contrast information of the ROI in the reference image may be weakened, that is, a difference in brightness or gray values among different types of tissues of the ROI in the reference image may be weakened. Specifically, because the contrast information of the ROI in the reference image is weakened, structures of different types of tissues of the ROI in the reference image may be weakened, or the structures of different types of tissues of the ROI may not be shown in the reference image. In other words, the reference image may include an image with no tissue structure or an image with weakened tissue structure of the ROI. For example, the contrast information between water and fat of the ROI in the reference image may be weakened or eliminated, so that a difference in structures of water and fat in the reference image is weakened or eliminated.

In the MR system, because the proton density, T1, and T2 of different types of tissues in the ROI are different, the brightness or gray values of different types of tissues in an image are different. The contrast information between different types of tissues in the image may reflect the structures of different types of tissues. The contrast information of the image is under a combined effect of the proton density difference, the T1 difference, the T2 difference, non-uniformity information of a receiving field, and non-uniformity information of a transmitting field. Therefore, a reference image in which the effect of certain feature parameters (such as the proton density, T1, T2) of different types of tissues of the ROI on the contrast information is weakened may be obtain by first pre-scanning the ROI based on a first acquisition sequence in the present disclosure, so that the contrast information of the reference image may be mainly related to non-uniformity information of the receiving field and the non-uniformity information of the transmitting field.

In some embodiments, a purpose of first pre-scanning the ROI to obtain a reference image in which the contrast information between at least two types of tissues of the ROI is weakened is to obtain a reference image with no tissue structure or a reference image with weakened tissue structure of the ROI, and then extract the non-uniformity information of the receiving field from the reference image.

According to the principle of magnetic resonance imaging, MR signals of different intensities may be reflected as different brightness or gray values in an image, thereby leading to image contrast information. For example, in an image, a region with larger brightness or gray values may correspond to stronger MR signals, and a region with smaller brightness or gray values may correspond to weaker MR signals. In some embodiments, the MR signal intensity may be affected by characteristics of different types of tissues, such as at least one of proton density, T1, and T2, resulting in differences in the MR signal intensity of different tissues, thus reflecting structural differences of different tissues in an image.

In some embodiments, the MR signal intensity may also be affected by receiving field non-uniformity information and transmitting field non-uniformity information. During a scanning process of the ROI, a radio frequency transmitting coil (e.g., a transmitting coil of RF coils 203) may execute a radio frequency pulse to generate a transmitting field at the ROI, and the ROI may be excited by the transmitting field to generate MR signals. However, responses of different positions of the ROI to the transmitting field may be different, thereby making different positions of the ROI generate MR signals with different intensities. The transmitting field non-uniformity information reflects the different responses of different positions of the ROI to the RF transmitting field. A radio frequency receiving coil (e.g., an RF receiving coil of the RF coils 203) may receive the MR signals generated by the ROI. In some embodiments, different positions of the RF receiving coil may have different sensitivities due to different distances from the ROI. For example, the radio frequency receiving coil may include an array including a plurality of receiving coil units, and the receiving coil units in different positions may have different sensitivities due to different distances from the ROI. The sensitivity of the RF receiving coil refers to a degree that the RF receiving coil responds to an input signal. The higher the sensitivity, the better the ability to detect weak signals. Therefore, the sensitivity can affect a measured intensity value of the MR signals received by the RF receiving coil. A sensitivity distribution (also referred to as the receiving field of the receiving coil) of the RF receiving coil may reflect the response of the RF receiving coil to the MR signals. The receiving field non-uniformity information reflects the sensitivity distribution of the RF receiving coil. The receiving field non-uniformity information and the transmitting field non-uniformity information may affect the contrast information of an image by affecting the intensity of the MR signals, so as to reflect the different distances of the RF receiving coil and the RF transmitting coil from the ROI in the image, but their contribution to the structural differences of different tissues in the image is relatively small.

Therefore, the contrast information of an image may include a combination of proton density difference, T1 difference, T2 difference, the receiving field non-uniformity information, and the transmitting field non-uniformity information. In some embodiments, the influence of at least one of T1, T2, and proton density on the MR signal intensity may be suppressed or weakened through the first acquisition sequence, so that the MR signal intensity is mainly affected by the receiving field non-uniformity information and the transmitting field non-uniformity information. Therefore, the structural difference of different tissues in the reference image is weakened. The contrast information in the reference image is mainly affected by the receiving field non-uniformity information and the transmitting field non-uniformity information.

In 620, the processing device 120 (e.g., the RF field determination module 520) may determine, based on the reference image, a preliminary radio frequency (RF) field map corresponding to the ROI.

The preliminary RF field map may include the receiving field non-uniformity information and the transmitting field non-uniformity information corresponding to the ROI. The contrast information of the reference image may include a combination of the transmitting field non-uniformity information and the receiving field non-uniformity information corresponding to the ROI. Therefore, the combination of the transmitting field non-uniformity information and the receiving field non-uniformity information corresponding to the ROI may be extracted from the reference image to obtain the preliminary RF field map.

In some embodiments, the obtained preliminary RF field map may be mixed with a transmitting field map (e.g., reflecting a response of each position in the ROI to the transmitting field) of the transmitting coil and a sensitivity distribution (e.g., reflecting a response of the receiving coil to the MR signals) of the receiving coil.

In some embodiments, the reference image may be directly designated as the preliminary RF field map corresponding to the ROI. In some embodiments, low frequency information may be extracted from the reference image, and an image reconstructed from the low-frequency information may be designated as the preliminary RF field map corresponding to the ROI.

In some embodiments, determining the preliminary RF field map corresponding to the ROI based on the reference image may include: extracting low frequency information of the reference image, and determining the preliminary RF field map corresponding to the ROI based on the low frequency information.

When the reference image is an image with no tissue structure, the reference image may be directly designated as the preliminary RF field map corresponding to the ROI. When the reference image is an image with weakened tissue structure, the reference image may include the preliminary RF field map and residual tissue structure information. The residual tissue structure information may be high frequency information and/or medium-high frequency information in the reference image, and the preliminary RF field map may be low frequency information in the reference image. Therefore, by extracting the low frequency information of the reference image or filtering out the high frequency information and/or the medium-high frequency information of the reference image, the preliminary RF field map corresponding to the ROI may be obtained. The low frequency information may refer to a region in an image where brightness or gray values change slowly. The high frequency information or the medium-high frequency information may refer to a region in an image where brightness or gray values change sharply.

For example, the low frequency information of the reference image may be obtained by means of rapid descent method, low-pass filtering, fitting calculation, seeking an optimal solution, or the like, or any combination thereof.

Methods for obtaining the low frequency information may not be limited in the present disclosure.

Advantages of determining the preliminary RF field map corresponding to the ROI by obtaining the low frequency information of the reference image include: improving the accuracy of the preliminary RF field map, thereby improving the accuracy of the receiving field information, and further improving the correction effect of the receiving field.

In 630, the processing device 120 (e.g., the sensitivity distribution determination module 530) may obtain a transmitting field map corresponding to the ROI.

In some embodiments, the transmitting field map of the transmitting coil may be determined by determining actual transmitting field information of the ROI by performing a second pre-scan based on a second acquisition sequence using an MRI device (e.g., the MRI device 110), and the actual transmitting field information of the ROI may be designated as the transmitting field map. The second acquisition sequence may be a sequence set in advance or set during the second pre-scan. The second acquisition sequence may be configured for determining the transmitting field non-uniformity information. For example, the second acquisition sequence may include a B1 mapping sequence, such as a double angle methods (DAM) sequence, an actual flip angle imaging (AFI) sequence, or the like, or any combination thereof.

In some embodiments, the actual transmitting field information corresponding to the ROI may be determined based on the second acquisition sequence, that is, the transmitting field map may be obtained. The actual transmitting field information may be the transmitting field non-uniformity information corresponding to the ROI.

In some embodiments, operation 630 may be performed before or after the operation 610 and/or 620.

Figure 10:
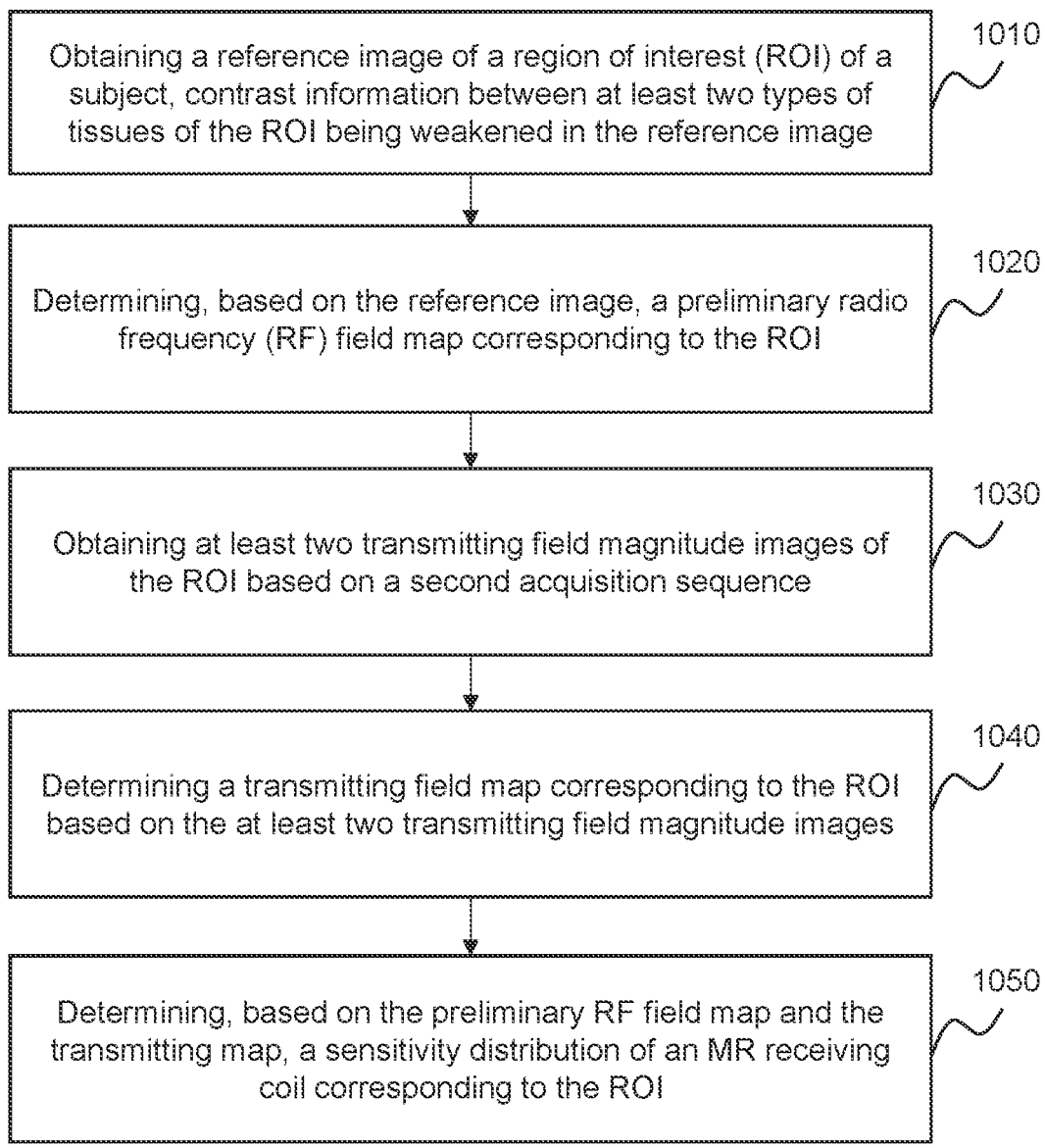
FIG. 10 is a flowchart illustrating an exemplary process for determining a sensitivity distribution of an MR receiving coil according to some embodiments of the present disclosure.

Details regarding determining the transmitting field map may be found elsewhere in the present disclosure (e.g., the description in connection with FIG. 10).

In 640, the processing device 120 (e.g., the sensitivity distribution determination module 530) may determine, based on the preliminary RF field map and the transmitting map, a sensitivity distribution of an MR receiving coil corresponding to the ROI.

Actual receiving field information of the ROI may be determined based on the preliminary RF field map and the transmitting field map, and the actual receiving field information of the ROI may be designated as the sensitivity distribution of the MR receiving coil corresponding to the ROI. The actual receiving field information may be the receiving field non-uniformity information corresponding to the ROI.

Figure 12:
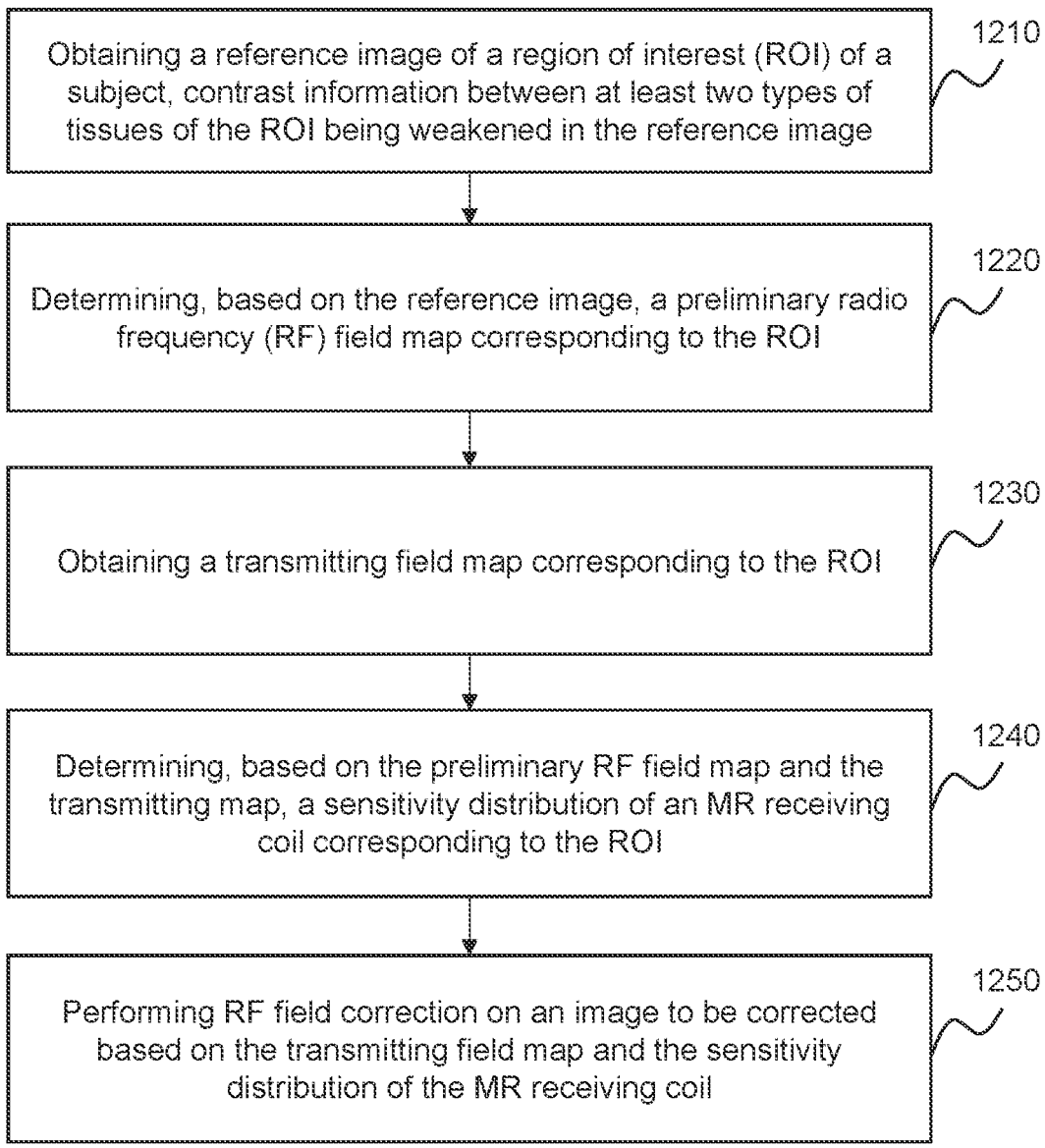
FIG. 12 is a flowchart illustrating an exemplary magnetic resonance (MR) image correction according to some embodiments of the present disclosure.

Details regarding determining the sensitivity distribution of the MR receiving coil may be found elsewhere in the present disclosure (e.g., the description in connection with FIG. 12).

In some embodiments, after determining the sensitivity distribution of the MR receiving coil, an image to be corrected of the ROI may be obtained, and according to the actual transmitting field information (e.g., the transmitting field map) and/or the actual receiving field information (e.g., the sensitivity distribution of the receiving coil), RF field correction may be performed on the image to be corrected to obtain a target image of the ROI. For example, the actual transmitting field information (e.g., the transmitting field map) may be configured to correct the transmitting field non-uniformity in the image to be corrected. As another example, the actual receiving field information (e.g., the sensitivity distribution of the receiving coil) may be configured to correct the receiving field non-uniformity in the image to be corrected.

The image to be corrected may be an image of the ROI obtained by performing a formal scan on the ROI using an MRI device (e.g., the MRI device 110), such as a T1 weighted image, a T2 weighted image, a proton density weighted image, or the like. Specifically, after obtaining the actual receiving field information and the actual transmitting field information of the ROI, the actual receiving field information and/or the actual transmitting field information may be designated as RF field correction information of the image to be corrected.

It should be noted that the image to be corrected may be corrected based on the actual transmitting field information and the actual receiving field information in turn or simultaneously to obtain the target image with the receiving field non-uniformity and the transmitting field non-uniformity being corrected. Alternatively, the image to be corrected may be corrected based on either the actual transmitting field information or the actual receiving field information. When the image to be corrected is corrected based on the actual transmitting field information and the actual receiving field information in turn, an order of correction may be correcting the transmitting field non-uniformity first, or correcting the receiving field non-uniformity first, which may not be limited in the present disclosure.

The existing suitable correction method may be applied to perform RF field correction on the image to be corrected based on the actual transmitting field information and/or the actual receiving field information, which may not be limited in the present disclosure. For example, the image to be corrected may be divided by the transmitting field map and/or the sensitivity distribution of the receiving coil. As another example, the image to be corrected may be corrected by subtracting the transmitting field map and/or the sensitivity distribution of the receiving coil from the image to be corrected.

In some embodiments, an image with no tissue structure information or an image with weakened tissue structure information (e.g., contrast information is weakened) may be obtained by adjusting one or more parameters of a first acquisition sequence, that is, the reference image may be obtained. Thus, the brightness information or gray value information of the reference image may be mainly related to the transmitting field non-uniformity information and the receiving field non-uniformity information. Then the actual transmitting field information may be obtained, thus the actual receiving field information may be determined. The one or more adjusted parameters may include a field of view (FOV), a matrix pixel of the reference image, a flip angle, an echo time, a repetition time, or the like, or any combination thereof.

In the present disclosure, the reference image with weakened contrast information of the ROI may be obtained based on the first acquisition sequence, the preliminary RF field map corresponding to the ROI may be determined based on the reference image, and according to the second acquisition sequence, the actual transmitting field information corresponding to the ROI may be obtained and designated as the transmitting field map of the transmitting field. Then the actual receiving field information may be determined based on the preliminary RF field map and the transmitting field map. The actual receiving field information may be designated as the sensitivity distribution of the MR receiving coil, thus the receiving field non-uniformity information of the RF field in the high field intensity MR system may be determined.

It should be noted that the above description regarding the process 600 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 600 may be accomplished with one or more additional operations not described and/or without one or more of the operations discussed above.

Figure 7:
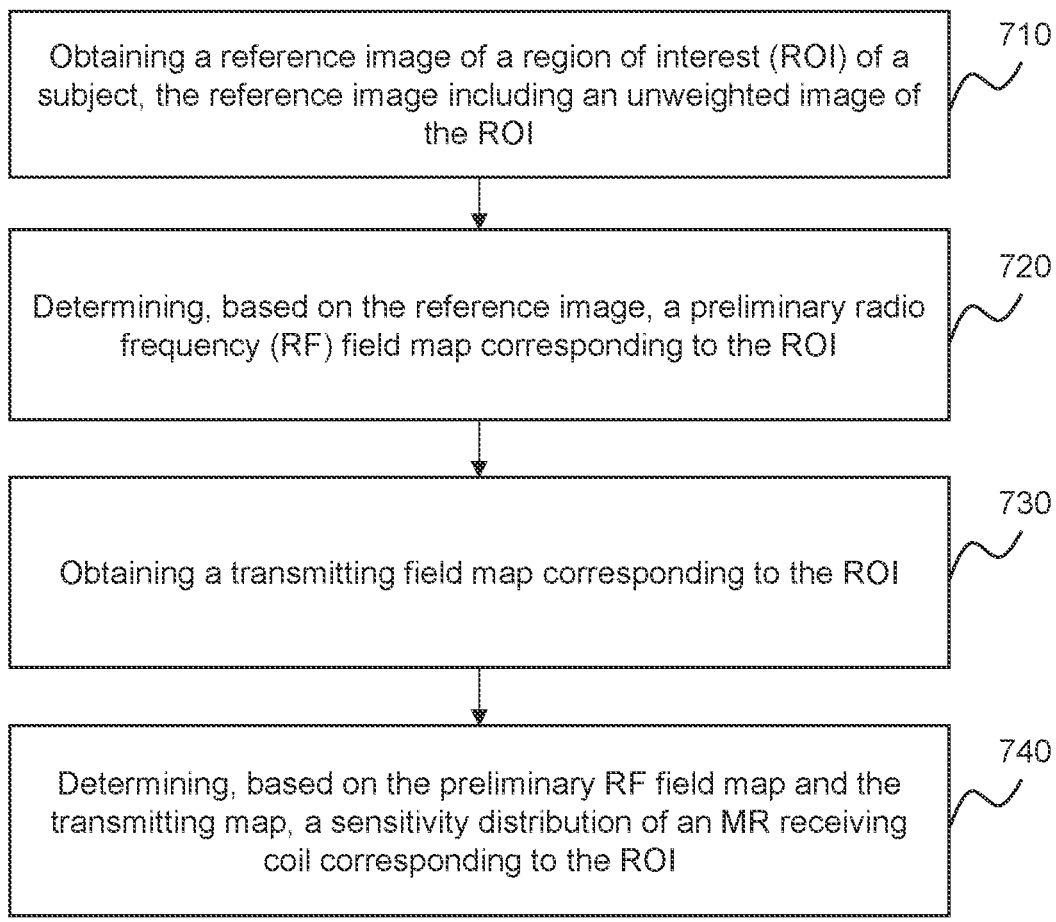
FIG. 7 is a flowchart illustrating an exemplary process for determining a sensitivity distribution of an MR receiving coil according to some embodiments of the present disclosure.

FIG. 7 is a flowchart illustrating an exemplary method for determining a sensitivity distribution of an MR receiving coil according to some embodiments of the present disclosure. In some embodiments, the process 700 may be implemented in the MRI system 100 illustrated in FIG. 1. For example, the process 700 may be stored in the storage device 130 and/or the storage (e.g., the storage 320, the storage 490) as a form of instructions, and invoked and/or executed by the processing device 120 (e.g., the processor 310 of the computing device 300 as illustrated in FIG. 3, the CPU 440 of the mobile device 400 as illustrated in FIG. 4). The operations of the illustrated process presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below is not intended to be limiting.

In 710, the processing device 120 (e.g., the reference image obtaining module 510) may obtain a reference image, wherein the reference image may include an unweighted image of the ROI. In some embodiments, the reference image may be determined by obtaining an unweighted image of the ROI based on a first acquisition sequence and designating the unweighted image as the reference image.

In some embodiments, the unweighted image may refer to an image generated by suppressing or weakening the influence of T1 and T2 on the contrast information. Since the influence of T1 and T2 on the contrast information is weakened in the unweighted image, the tissue structure information of at least two types of tissues of the ROI in the unweighted image may be weakened. In other words, the unweighted image of the ROI may be obtained by scanning the ROI using the first acquisition sequence, and the unweighted image may be designated as the reference image.

For example, the first acquisition sequence may be a three-dimensional (3D) gradient echo sequence. In some embodiments, the first acquisition sequence may include one or more scanning parameters. For example, the one or more scanning parameters may include an FOV of the MRI device 110, a matrix pixel of the reference image, a flip angle, an echo time, a repetition time, or the like, or any combination thereof. The matrix pixel may be a matrix size of pixels of the reference image, e.g., an image resolution of the reference image.

In some embodiments, the one or more scanning parameters may include: an FOV including the ROI, a relatively small matrix pixel, a relatively small flip angle, an in-phase echo time, and a relatively small repetition time, or the like, or any combination thereof. The relatively small flip angle may make a response of the first acquisition sequence to the flip angle linear, and make the transmitting field non-uniformity information linearly shown in the brightness or gray values of the reference image. The purpose of the one or more scanning parameters is weakening the contrast information of different types of tissues at the ROI in the reference image by suppressing the influence of T1 and T2 on the intensity of the MR signals, so as to obtain an image with no tissue structure or an image with weakened tissue structure, thus extracting the receiving field non-uniformity information from the reference image.

For example, the one or more scanning parameters of the first acquisition sequence may include: a matrix pixel with 32×32 pixels, a flip angle of 1°~15° that makes a response of the first acquisition sequence to the flip angle linear and makes the transmitting field non-uniformity information linearly shown in the brightness or gray values of the reference image, an in-phase TE of water and fat of the ROI, a TR much smaller than T1 and T2 of tissues (e.g., water and fat) of the ROI. The first acquisition sequence may suppress or weaken the influence of T1 and T2 on the contrast information and the structure difference of the tissues in the reference image may be weakened.

In 720, the processing device 120 (e.g., the RF field determination module 520) may determine, based on the reference image, a preliminary radio frequency (RF) field map corresponding to the ROI.

In 730, the processing device 120 (e.g., the sensitivity distribution determination module 530) may obtain a transmitting field map corresponding to the ROI.

In 740, the processing device 120 (e.g., the sensitivity distribution determination module 530) may determine, based on the preliminary RF field map and the transmitting map, a sensitivity distribution of MR receiving coils corresponding to the ROI.

Operations 720-740 are similar to operations 620-640, and may not be described herein.

It should be noted that the above description regarding the process 700 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 700 may be accomplished with one or more additional operations not described and/or without one or more of the operations discussed above.

Figure 8:
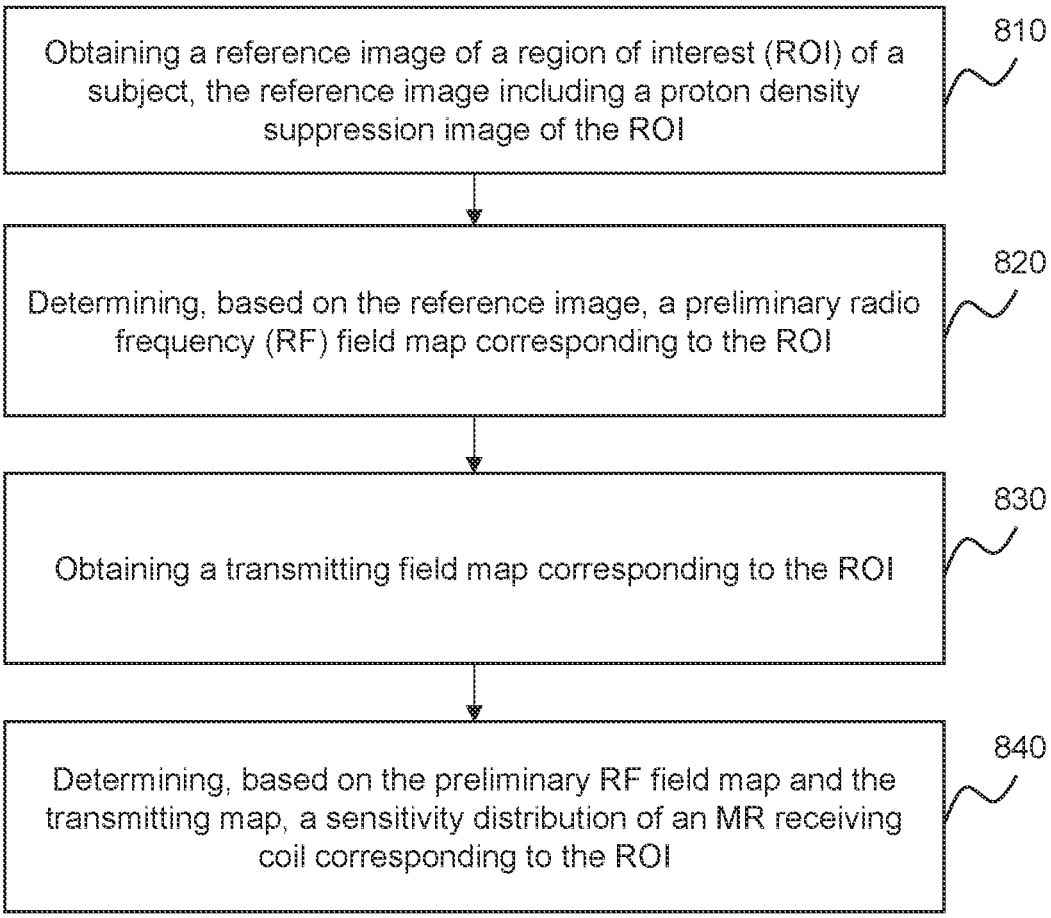
FIG. 8 is a flowchart illustrating an exemplary process for determining a sensitivity distribution of an MR receiving coil according to some embodiments of the present disclosure.

FIG. 8 is a flowchart illustrating an exemplary process for determining a sensitivity distribution of an MR receiving coil according to some embodiments of the present disclosure. In some embodiments, the process 800 may be implemented in the MRI system 100 illustrated in FIG. 1. For example, the process 800 may be stored in the storage device 130 and/or the storage (e.g., the storage 320, the storage 490) as a form of instructions, and invoked and/or executed by the processing device 120 (e.g., the processor 310 of the computing device 300 as illustrated in FIG. 3, the CPU 440 of the mobile device 400 as illustrated in FIG. 4). The operations of the illustrated process presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting.

In some embodiments, in the process 800, the first pre-scan to the ROI based on the first acquisition sequence to obtain the reference image may include: obtaining a proton density suppression image of the ROI based on the first acquisition sequence, and designating the proton density suppression image as the reference image.

In 810, the processing device 120 (e.g., the reference image obtaining module 510) may obtain a reference image, wherein the reference image may include a proton density suppression image of the ROI.

In some embodiments, the reference image may be determined as follows: according to the first acquisition sequence, the proton density suppression image of different types of tissues of the ROI may be obtained, and the proton density suppression image may be designated as the reference image.

The first acquisition sequence may include one or more scanning parameters. The one or more scanning parameters may include an FOV of the MRI device 110, a matrix pixel of the reference image, a flip angle, an echo time, a repetition time, or the like, or any combination thereof. The first acquisition sequence may include a 3D gradient echo sequence.

In some embodiments, the contrast difference between different types of tissues of the ROI may be adjusted by the first acquisition sequence. In some embodiments, adjusting the contrast difference between the tissues of the ROI based on the first acquisition sequence may include reducing a level of the contrast difference between the different types of tissues of the ROI based on the first acquisition sequence. Specifically, by reducing the level of the contrast difference, a difference level between a bright region and a dark region in the ROI may be reduced, and a difference level of brightness or gray values of the different types of tissues on the image may be reduced. Thus, the difference level of brightness or gray values between the bright region and the dark region may be minimized, and an image with weakened contrast information of different types of tissues of the ROI may be obtained.

In some embodiments, adjusting the contrast difference between the different types of tissues of the ROI based on the first acquisition sequence may include: adjusting the brightness or gray values between the different types of tissues of the ROI based on the first acquisition sequence to reduce a difference of brightness or gray values between the different types of tissues. Specifically, the brightness or gray values of the different types of tissues of the ROI may be adjusted based on the first acquisition sequence. The brightness or gray values of a bright tissue may be decreased, and the brightness or gray values of a dark tissue may be increased, thus the difference of brightness or gray values between the bright region and the dark region may be reduced, and an image with the weakened contrast information of different types of tissues of the ROI may be obtained.

In some embodiments, the method of adjusting the brightness or gray values of the different types of tissues of the ROI may include determining an average of the brightness or gray values of the different types of tissues of the ROI, and according to the average of the brightness or gray values, adjusting the brightness or gray values of different types of tissues of the ROI.

The average of the brightness or gray values may be an average of overall brightness or gray values of the ROI. Specifically, the brightness or gray values of different types of tissues of the ROI may be adjusted based on the average of the brightness or gray values in the above embodiments. Thus, the brightness or gray values of different types of tissues may approach the average of the brightness or gray values, the contrast difference between the different types of tissues may be reduced, and the reference image including non-uniformity information of the RF field may be obtained.

In some embodiments, a method of increasing or decreasing the brightness or gray values of the different types of tissues of the ROI based on the average of the brightness or gray values may include: reducing the brightness or gray values of a tissue whose brightness or gray values are higher than the average of the brightness or gray values, and increasing the brightness or gray values of a tissue whose brightness or gray values is lower than the average of the brightness or gray values. Or, according to the average of the brightness or gray values, the brightness or gray values of the different types of tissues of the ROI may be adjusted in a manner of offset/compensation.

Specifically, adjusting the brightness or gray values of the different types of tissues of the ROI in the manner of offset may be understood as mutually compensating the brightness or gray values of the different types of tissues. For example, using higher brightness or gray values of a tissue to compensate lower brightness or gray values of a tissue. Thus, the brightness or gray values of the different types of tissues after compensation may be equal to the average of the brightness or gray values, or may approach the average of the brightness or gray values, then an image with the weakened contrast information of different types of tissues of the ROI may be obtained.

The contrast difference between the different types of tissues of the ROI may be adjusted while adjusting the brightness or gray values of the different types of tissues of the ROI in some embodiments, thus the tissue structure of the ROI in the reference image may further be weakened.

In the unweighted image, the influence of T1 and T2 on the contrast information may be suppressed, and a structure difference between different types of tissues may be weakened. However, the contrast information may be still affected by the proton densities of different types of tissues. Therefore, the unweighted image may still show a certain degree of structure difference of different types of tissues. For example, the unweighted image may be an image with weakened tissue structure. For example, the proton density of water is less than the proton density of fat. Water may be presented as a darker region and fat may be presented as a brighter region in the unweighted image. In the proton density suppression image, compared with the unweighted image, the influence of proton density on the contrast information may be further suppressed, and the structure difference between different types of tissues may further be weakened.

In some embodiments, the first acquisition sequence may adjust the influence of proton density, T1, and T2 on the MR signal intensity to obtain the proton density suppression image. In some embodiments, the first acquisition sequence may suppress the influence of proton density, T1, and T2 on the MR signal intensity to obtain the proton density suppression image. In some embodiments, through the first acquisition sequence, the influence of proton density, T1, and T2 on the MR signal intensity may be complementary, thereby reducing the difference in the MR signal intensity of different tissues, and generating a proton density suppression image in which the structure difference of different tissues is not obvious. For example, through adjusting at least one of an FOV of the MRI device 110, a matrix pixel of the reference image, a flip angle, an echo time, and a repetition time of the first acquisition sequence, the difference in the MR signal intensity of different tissues may be reduced, and an image with no tissue structure may be acquired.

In 820, the processing device 120 (e.g., the RF field determination module 520) may determine, based on the reference image, a preliminary radio frequency (RF) field map corresponding to the ROI.

In 830, the processing device 120 (e.g., the sensitivity distribution determination module 530) may obtain a transmitting field map corresponding to the ROI.

In 840, the processing device 120 (e.g., the sensitivity distribution determination module 530) may determine, based on the preliminary RF field map and the transmitting map, a sensitivity distribution of MR receiving coils corresponding to the ROI.

Operations 820-840 are similar to operations 620-640, and may not be described herein.

The contrast difference between different types of the ROI may be adjusted based on the first acquisition sequence to obtain the reference image with the weakened tissue structure information. Thus, the reference image may mainly include the preliminary RF field map, then the receiving field non-uniformity information may be determined. Moreover, according to the method for determining the receiving field non-uniformity information provided by the present disclosure, the receiving field non-uniformity information and the transmitting field non-uniformity information may be corrected independently, and the correction effect of the RF field may be improved.

It should be noted that the above description regarding the process 800 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 800 may be accomplished with one or more additional operations not described and/or without one or more of the operations discussed above.

Figure 9:
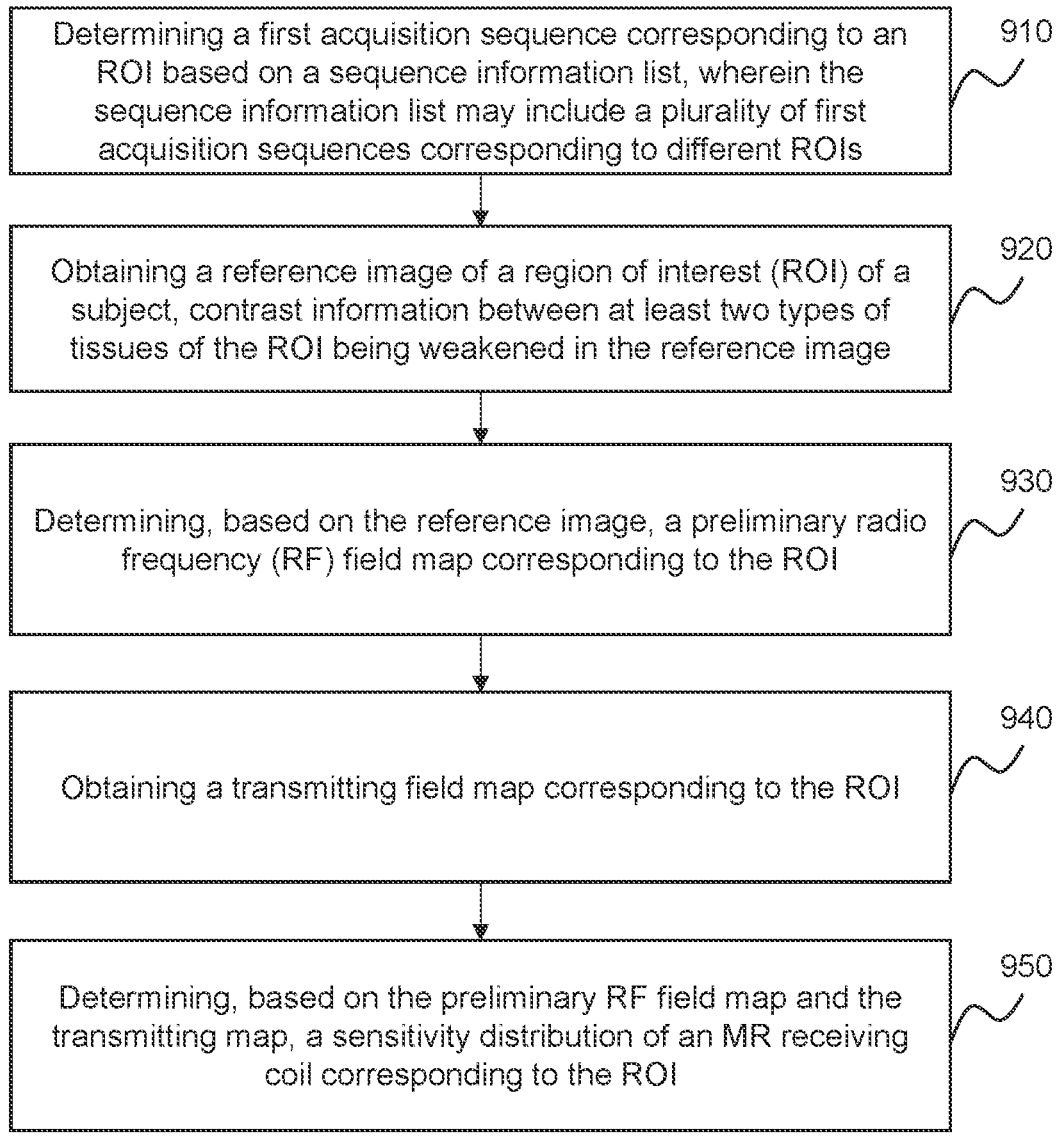
FIG. 9 is a flowchart illustrating an exemplary process for determining a sensitivity distribution of an MR receiving coil according to some embodiments of the present disclosure.

FIG. 9 is a flowchart illustrating an exemplary processing for determining a sensitivity distribution of an MR receiving coil according to some embodiments of the present disclosure. In some embodiments, the process 900 may be implemented in the MRI system 100 illustrated in FIG. 1. For example, the process 900 may be stored in the storage device 130 and/or the storage (e.g., the storage 320, the storage 490) as a form of instructions, and invoked and/or executed by the processing device 120 (e.g., the processor 310 of the computing device 300 as illustrated in FIG. 3, the CPU 440 of the mobile device 400 as illustrated in FIG. 4). The operations of the illustrated process presented below are intended to be illustrative. In some embodiments, the process 900 may be accomplished with one or more additional operations not described, and/or without one or more of the operations discussed. Additionally, the order in which the operations of the process 900 as illustrated in FIG. 9 and described below is not intended to be limiting.

In some embodiments, the first acquisition sequence corresponding to the ROI may be determined based on a sequence information list. The sequence information list may include a plurality of acquisition sequences corresponding to different ROIs.

In 910, the processing device 120 (e.g., the reference image obtaining module 510) may determine a first acquisition sequence corresponding to the ROI based on the sequence information list, wherein the sequence information list may include a plurality of acquisition sequences corresponding to different ROIs.

Because sizes of different types of ROIs are different, and the anti-electric effect and the RF electromagnetic wave corresponding to different ROIs are also different, the non-uniformity information of the RF field corresponding to different ROIs are different.

Therefore, for the same ROI, the actual transmitting field information and the actual receiving field information may be obtained in one measurement and used for a repeated correction of the ROI. For different ROIs, the actual receiving field information and the actual transmitting field information for each ROI may need to be determined respectively. That is, the actual receiving field information (the sensitivity distribution of the MR receiving coil corresponding to the ROI) and the actual transmitting field information (the transmitting field map of the transmitting field corresponding to the ROI) of different ROIs may be determined separately. When the actual receiving field information of each ROI is determined separately, the first acquisition sequences corresponding to different ROIs may also be different. Specifically, the sequence parameters of the first acquisition sequences of different ROIs may be different.

Therefore, the sequence information list may be predetermined. The sequence information list may store a plurality of first acquisition sequences of different types of ROIs, such as a first acquisition sequence A for scanning liver, a first acquisition sequence B for scanning breast, or the like. When the actual receiving field information of the ROI needs to be determined, the first acquisition sequence corresponding to the ROI may be queried in the sequence information list, then the reference image may be obtained based on the first acquisition sequence.

The sequence information list may also include a plurality of first acquisition sequences corresponding to different sizes of ROIs. Accordingly, performing the first pre-scan on the ROI based on the first acquisition sequence may include: determining a size of the ROI, and according to the sequence information list, determining the first acquisition sequence corresponding to the size of the ROI.

In 920, the processing device 120 (e.g., the reference image obtaining module 510) may obtain a reference image of a region of interest (ROI) of a subject. Contrast information between at least two types of tissues of the ROI may be weakened in the reference image.

In 930, the processing device 120 (e.g., the RF field determination module 520) may determine, based on the reference image, a preliminary radio frequency (RF) field map corresponding to the ROI.

In 940, the processing device 120 (e.g., the sensitivity distribution determination module 530) may obtain a transmitting field map corresponding to the ROI.

In 950, the processing device 120 (e.g., the sensitivity distribution determination module 530) may determine, based on the preliminary RF field map and the transmitting map, a sensitivity distribution of MR receiving coils corresponding to the ROI.

Operations 920-950 are similar to operations 610-640, and may not be described herein.

The first acquisition sequence corresponding to the ROI may be queried based on the sequence information list. The first acquisition sequence for each ROI may not need to be obtained, and the first acquisition sequence of an ROI may be obtained merely based on a query in the sequence information list. Thus, the efficiency of determining the sensitivity distribution of the MR receiving coil corresponding to the ROI may be improved, and the correction efficiency of the image to be corrected of the ROI may be further improved.

It should be noted that the above description regarding the process 900 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 900 may be accomplished with one or more additional operations not described and/or without one or more of the operations discussed above.

FIG. 10 is a flowchart illustrating an exemplary processing for determining a sensitivity distribution of an MR receiving coil according to some embodiments of the present disclosure. In some embodiments, the process 1000 may be implemented in the MRI system 100 illustrated in FIG. 1. For example, the process 1000 may be stored in the storage device 130 and/or the storage (e.g., the storage 320, the storage 490) as a form of instructions, and invoked and/or executed by the processing device 120 (e.g., the processor 310 of the computing device 300 as illustrated in FIG. 3, the CPU 440 of the mobile device 400 as illustrated in FIG. 4). The operations of the illustrated process presented below are intended to be illustrative. In some embodiments, the process 1000 may be accomplished with one or more additional operations not described, and/or without one or more of the operations discussed. Additionally, the order in which the operations of the process 1000 as illustrated in FIG. 10 and described below is not intended to be limiting.

In some embodiments, determining the actual transmitting field information of the ROI based on the second acquisition sequence may include: acquiring at least two transmitting field magnitude images of the ROI based on the second acquisition sequence, and determining the actual transmitting information of the ROI based on the at least two transmitting field magnitude images.

In 1010, the processing device 120 (e.g., the reference image obtaining module 510) may obtain a reference image of a region of interest (ROI) of a subject. Contrast information between at least two types of tissues of the ROI may be weakened in the reference image.

In 1020, the processing device 120 (e.g., the RF field determination module 520) may determine, based on the reference image, a preliminary radio frequency (RF) field map corresponding to the ROI.

Operations 1010 and 1020 are similar to operations 610 and 620, and may not be described herein.

In 1030, the processing device 120 (e.g., the sensitivity distribution determination module 530) may obtain at least two transmitting field magnitude images of the ROI based on a second acquisition sequence.

In some embodiments, the second acquisition sequence may be a B1 mapping sequence, such as a DAM sequence, an AFI sequence, or the like, or any combination thereof. Specifically, a second pre-scan may be performed based on the second acquisition sequence using an MRI device (e.g., the MRI device 110) to acquire at least two images reflecting transmitting field magnitude of the transmitting field, that is, the at least two transmitting field magnitude images.

In 1040, the processing device 120 (e.g., the sensitivity distribution determination module 530) may determine the transmitting field map corresponding to the ROI based on the at least two transmitting field magnitude images.

In some embodiments, signals unrelated to the transmitting field in the at least two transmitting field magnitude images may be removed based on the at least two transmitting field magnitude images, and then an actual transmitting field magnitude may be determined.

Figure 11:
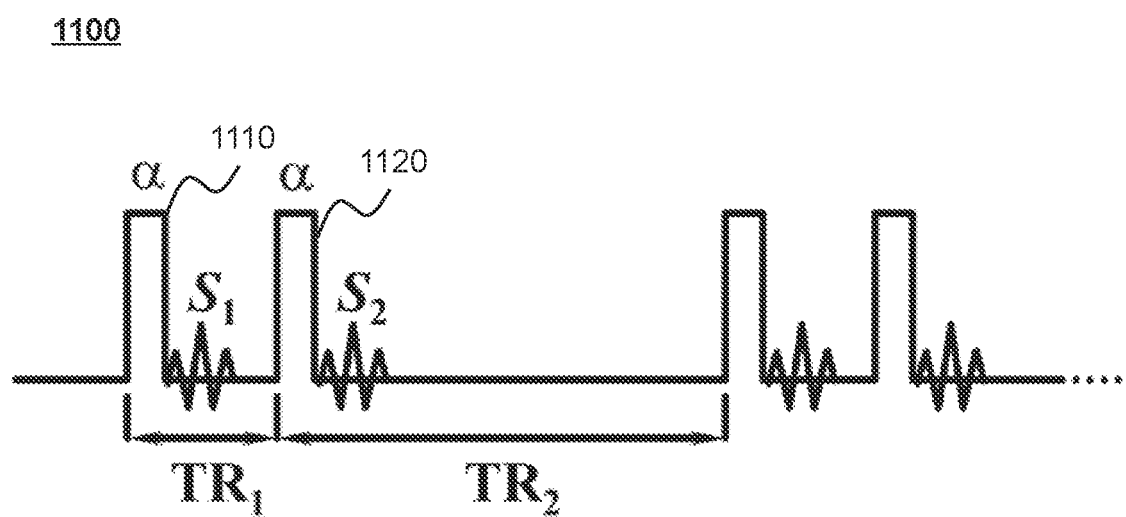
FIG. 11 is a schematic diagram illustrating an exemplary second acquisition sequence according to some embodiments of the present disclosure.

As shown in FIG. 11, the second acquisition sequence 1100 is an AFI sequence. The second acquisition sequence may include a first RF pulse 1110 with a flip angle α, and a second RF pulse 1120 with a flip angle α. A repetition time of the first RF pulse 1110 may be $TR_1$, and a repetition time of the second RF pulse 1120 may be $TR_2$. A signal magnitude (also referred to as signal intensity) acquired after the first RF pulse 1110 excites the ROI may be $S_1$, and a signal magnitude acquired after the second RF pulse 1120 excites the ROI may be $S_2$. An intensity of the signal excited by the first RF pulse 1110 and the second RF pulse 1120 may be expressed as Equations (1)-(4):

$$S_1 = M_{z1} \exp\left(-\frac{TE}{T_2^*}\right) \sin\alpha, \qquad (1)$$

$$S_2 = M_{z2} \exp\left(-\frac{TE}{T_2^*}\right) \sin\alpha, \qquad (2)$$

$$M_{z1} = M_0 \frac{1 - E_2 + (1 - E_1)E_2 \cos\alpha}{1 - E_1 E_2 \cos^2\alpha}, \qquad (3)$$

$$M_{z2} = M_0 \frac{1 - E_1 + (1 - E_2)E_1 \cos\alpha}{1 - E_1 E_2 \cos^2\alpha}, \qquad (4)$$

where $M_{z1}$ represents a transverse magnetization vector of the ROI after the ROI is excited by the first RF pulse 1110; $M_{z2}$ represents a transverse magnetization vector of the ROI after the ROI is excited by the second RF pulse 1120; $M_0$ represents a longitudinal magnetization vector;

$$E_1 = \exp\left(-\frac{TR_1}{T_1}\right), E_2 = \exp\left(-\frac{TR_2}{T_1}\right);$$

TE represents an echo time; and T1, T2, and T2* are relaxation constants, respectively. For example, two transmitting field magnitude images may be selected from the at least two transmitting field magnitude images, and one of the two transmitting field magnitude images may be divided by or subtracted from another of the two transmitting field magnitude images, thus an image related to the transmitting field magnitude may be obtained. According to the image related to the transmitting field magnitude, the actual transmitting field information of the ROI may be determined.

In some embodiment, dividing the one of the two transmitting field magnitude images by another of the two transmitting field magnitude images, or subtracting the one of the two transmitting field magnitude images from another of the two transmitting field magnitude images may be configured to determine a scale factor r of each position of the ROI in the transmitting field, and the scale factor r may be a function of the flip angle. Therefore, a response of each position of the ROI to the transmitting field may be determined based on the scale factor, that is, a factor of the transmitting pulse (a flip angle) in each position of the ROI may be determined. The flip angles obtained based on intensities of two signals in each position of the ROI may be the transmitting field map corresponding to the ROI.

$$r = S_2/S_1 = \frac{1 - E_1 + (1 - E_2)E_1 \cos\alpha}{1 - E_2 + (1 - E_2)E_2 \cos\alpha}. \qquad (5)$$

-continued $$r \approx \frac{1 + n\cos\alpha}{n + \cos\alpha}. \quad (6)$$

$$\alpha \approx \arccos\frac{rn - 1}{n - r}. \quad (7)$$

In above Equations (5)-(7), n is a constant, specifically, n is a ratio of the repetition time of the first RF pulse 1110 and the repetition time of the second RF pulse 1120.

In 1050, the processing device 120 (e.g., the sensitivity distribution determination module 530) may determine, based on the preliminary RF field map and the transmitting map, a sensitivity distribution of MR receiving coils corresponding to the ROI.

Operation 1050 is similar to operation 640, and may not be described herein.

The actual transmitting field information may be obtained by scanning the ROI to obtain the at least two transmitting field magnitude images, and the actual transmitting field information may be designated as the transmitting field map corresponding to the ROI, and then the actual receiving field information may be determined accurately.

In some embodiments, at least two transmitting field phase images of the ROI may be obtained based on a third acquisition sequence, and the actual transmitting field information of the ROI may be determined based on the at least two transmitting field phase images. The transmitting field phase image may be an image reflecting the phase change of the transmitting field. That is, the spatial distribution of the actual transmitting field is determined by detecting the signal phase change caused by the transmitting field.

It should be noted that the above description regarding the process 1000 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 1000 may be accomplished with one or more additional operations not described and/or without one or more of the operations discussed above.

FIG. 12 is a flowchart illustrating an exemplary magnetic resonance (MR) image correction according to some embodiments of the present disclosure. In some embodiments, the process 1200 may be implemented in the MRI system 100 illustrated in FIG. 1. For example, the process 1200 may be stored in the storage device 130 and/or the storage (e.g., the storage 320, the storage 490) as a form of instructions, and invoked and/or executed by the processing device 120 (e.g., the processor 310 of the computing device 300 as illustrated in FIG. 3, the CPU 440 of the mobile device 400 as illustrated in FIG. 4). The operations of the illustrated process presented below are intended to be illustrative. In some embodiments, the process 1200 may be accomplished with one or more additional operations not described, and/or without one or more of the operations discussed. Additionally, the order in which the operations of the process 1200 as illustrated in FIG. 12 and described below is not intended to be limiting.

In the process 1200, a preliminary RF field map including the non-uniformity of the transmitting field and the non-uniformity of the receiving field may be obtained, and then the non-uniformity of the transmitting field may be obtained. According to the non-uniformity of the transmitting field, the non-uniformity of the receiving field may be estimated.

In the present disclosure, a method for estimating the non-uniformity of the receiving field in the high magnetic field may be achieved, and the non-uniformity of the receiving field may be corrected independently in the image to be corrected.

In 1210, the processing device 120 (e.g., the reference image obtaining module 510) may obtain a reference image of a region of interest (ROI) of a subject. Contrast information between at least two types of tissues of the ROI may be weakened in the reference image.

In 1220, the processing device 120 (e.g., the RF field determination module 520) may determine, based on the reference image, a preliminary radio frequency (RF) field map corresponding to the ROI.

In 1230, the processing device 120 (e.g., the sensitivity distribution determination module 530) may obtain a transmitting field map corresponding to the ROI.

Operations 1210-1230 are similar to operations 610-630, and may not be described herein.

Figure 13A:
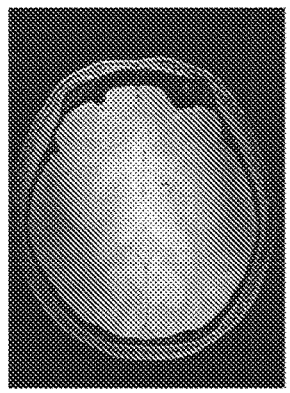
FIG. 13A is a schematic diagram illustrating an exemplary reference image according to some embodiments of the present disclosure.
Figure 13B:
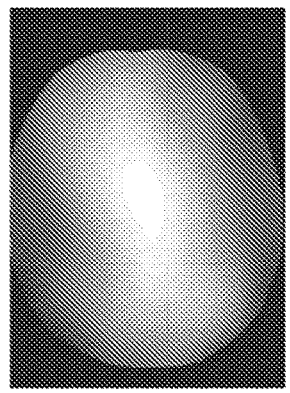
FIG. 13B is a schematic diagram illustrating an exemplary preliminary radio frequency (RF) field map according to some embodiments of the present disclosure.
Figure 13C:
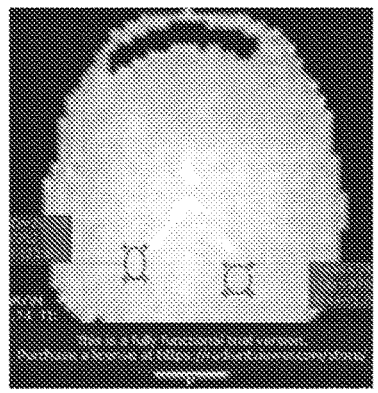
FIG. 13C is a schematic diagram illustrating an exemplary transmitting field map according to some embodiments of the present disclosure.
Figure 14A:
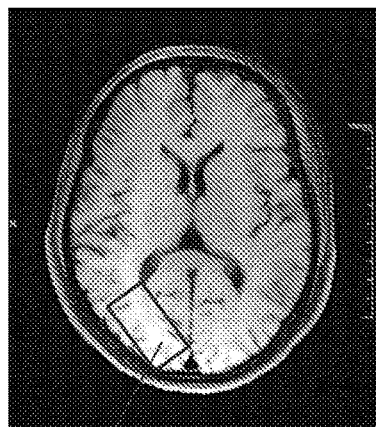
FIG. 14A is a schematic diagram illustrating an exemplary image to be corrected according to some embodiments of the present disclosure.
Figure 14B:
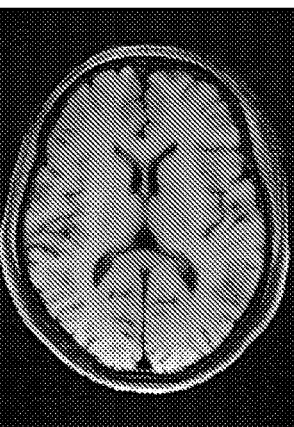
FIG. 14B is a schematic diagram illustrating an exemplary target image generated by correcting the image to be corrected in FIG. 14A using an RF field correction method according to some embodiments of the present disclosure.
Figure 14C:
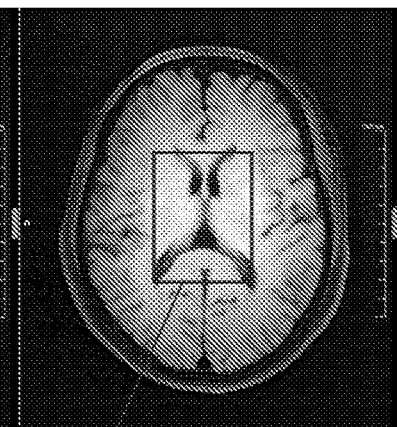
FIG. 14C is a schematic diagram illustrating an exemplary image generated by performing transmitting field correction on the image to be corrected in FIG. 14A.

Merely by way of example, the ROI may be designated as head. As shown in FIG. 13A, the image 1300-1 is a reference image obtained by some embodiments of the present disclosure. In the image 1300-1 (e.g., an image with weakened tissue structure), the contrast information of gray matter and the white matter of head is weakened, and the structure difference of gray matter and white matter of head is suppressed. The image 1300-2 is the preliminary RF field map obtained in some embodiments of the present disclosure. The preliminary RF field map may have a good uniformity and almost no tissue structure information. The image 1300-3 is the transmitting field map obtained in some embodiments of the present disclosure, which also has good uniformity. In some embodiments, after homogenizing the transmitting field map, a differential process may be performed on the preliminary RF field map and the transmitting field map to obtain the sensitivity distribution map of the MR receiving coil.

In 1240, the processing device 120 (e.g., the sensitivity distribution determination module 530) may determine, based on the preliminary RF field map and the transmitting map, a sensitivity distribution of an MR receiving coil corresponding to the ROI.

In 1250, the processing device 120 (e.g., the sensitivity distribution determination module 530) may perform RF field correction on an image to be corrected based on the transmitting field map and the sensitivity distribution of the MR receiving coil to obtain a corrected MR image (e.g., a target image) of the ROI.

Merely by way of example, as shown in FIG. 13A, the image 1400-1 is an MR image to be corrected. Region 1410 of the MR image 1400-1 is affected by the non-uniformity of RF field. The intensity of the MR signals in the region 1410 is great, and the intensity of the MR signals in other regions is weak, which makes the region 1410 brighter than other regions, thereby leading to uneven brightness of the MR image 1400-1. The image 1400-2 shows a corrected MR image obtained by performing the method for RF field correction in the present disclosure on the image 1400-1, and the brightness uniformity of the corrected MR image 1400-2 has been significantly improved. As a comparison, the image 1400-3 shows an image obtained by performing only transmitting field correction on the image 1400-1. The brightness of the middle region (e.g., the region 1420) of the image 1400-3 is still prominent, and the brightness of the image 1400-3 is still uneven.

It should be noted that the above description regarding the process 1200 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 1200 may be accomplished with one or more additional operations not described and/or without one or more of the operations discussed above.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

What is claimed is:

1. A method for determining a sensitivity distribution of magnetic resonance (MR) receiving coils, implemented on a computing device having at least one processing device and at least one storage device, the method comprising:
    obtaining a reference image of a region of interest (ROI) of a subject by performing a first scan on the ROI based on a first acquisition sequence, structures of at least two types of tissues of the ROI in the reference image being suppressed or weakened by setting one or more specific scanning parameters of the first acquisition sequence;
    determining, based on the reference image, a preliminary radio frequency (RF) field map corresponding to the ROI;
    obtaining a transmitting field map corresponding to the ROI by performing a second scan on the ROI based on a second acquisition sequence; and
    determining, based on the preliminary RF field map and the transmitting map, a sensitivity distribution of MR receiving coils corresponding to the ROI.

2. The method of claim 1, wherein the reference image includes an unweighted image of the ROI in which an effect caused by T1 and T2 of the at least two types of tissues on contrast information of the at least two types of tissues of the ROI is weakened, wherein T1 refers to a time constant for regrowth of longitudinal magnetization, and T2 refers to a time constant for decay or dephasing of transverse magnetization.

3. The method of claim 1, wherein the reference image includes a proton density suppression image of the ROI in which an effects caused by proton density of the at least two types of tissues on contrast information of the at least two types of tissues of the ROI is adjusted.

4. The method of claim 1, wherein the first acquisition sequence is a three-dimensional (3D) gradient echo sequence.

5. The method of claim 1, wherein the one or more specific scanning parameters of the first acquisition sequence include:
a flip angle of an excitation RF pulse within 1°-15°;
an echo time (TE) of the at least two types of tissues in phase; and
a repetition time (TR) less than T1 values and T2 values of the at least two types of tissues.

6. The method of claim 1, wherein
when the reference image is an image with no tissue structure, the reference image is directly designated as the preliminary RF field map corresponding to the ROI.

7. The method of claim 1, wherein obtaining the transmitting field map corresponding to the ROI includes:
acquiring at least two transmitting field magnitude images based on the second acquisition sequence; and
determining the transmitting field map based on the at least two transmitting field magnitude images.

8. The method of claim 1, further comprising:
correcting an MR image of the ROI based on the transmitting field map and the sensitivity distribution.

9. A system for determining a sensitivity distribution of magnetic resonance (MR) receiving coils, comprising:
at least one storage device including a set of instructions; and
at least one processor in communication with the at least one storage device, wherein when executing the set of instructions, the at least one processor is directed to perform operations including:
obtaining a reference image of a region of interest (ROI) of a subject by performing a first scan on the ROI based on a first acquisition sequence, structures of at least two types of tissues of the ROI in the reference image being suppressed or weakened by setting one or more specific scanning parameters of the first acquisition sequence;
determining, based on the reference image, a preliminary radio frequency (RF) field map corresponding to the ROI;
obtaining a transmitting field map corresponding to the ROI by performing a second scan on the ROI based on a second acquisition sequence; and
determining, based on the preliminary RF field map and the transmitting map, a sensitivity distribution of MR receiving coils corresponding to the ROI.

10. The system of claim 9, wherein the reference image includes an unweighted image of the ROI in which an effect caused by T1 and T2 of the at least two types of tissues on contrast information of the at least two types of tissues of the ROI is weakened, wherein T1 refers to a time constant for regrowth of longitudinal magnetization, and T2 refers to a time constant for decay or dephasing of transverse magnetization.

11. The system of claim 9, wherein the reference image includes a proton density suppression image of the ROI in which an effects caused by proton density of the at least two types of tissues on contrast information of the at least two types of tissues of the ROI is adjusted.

12. The system of claim 9, wherein the first acquisition sequence is a three-dimensional (3D) gradient echo sequence.

13. The system of claim 9, wherein the one or more specific scanning parameters of the first acquisition sequence include:
a flip angle of an excitation RF pulse within 1°-15°;
an echo time (TE) of the at least two types of tissues in phase; and
a repetition time (TR) less than T1 values and T2 values of the at least two types of tissues.

14. The system of claim 9, wherein determining, based on the reference image, the preliminary RF field map corresponding to the ROI includes:
extracting low frequency information of the reference image; and
determining the preliminary RF field map based on the low frequency information.

15. The system of claim 9, wherein obtaining the transmitting field map corresponding to the ROI includes:
acquiring at least two transmitting field magnitude images based on the second acquisition sequence; and
determining the transmitting field map based on the at least two transmitting field magnitude images.

16. The system of claim 9, wherein the at least one processor is directed to perform the operations including:
correcting an MR image of the ROI based on the transmitting field map and the sensitivity distribution.

17. A non-transitory computer readable medium, comprising at least one set of instructions, wherein when executed by one or more processors of a computing device, the at least one set of instructions causes the computing device to perform a method, the method comprising:
obtaining a reference image of a region of interest (ROI) of a subject by performing a first scan on the ROI based on a first acquisition sequence, structures of at least two types of tissues of the ROI in the reference image being suppressed or weakened by setting one or more specific scanning parameters of the first acquisition sequence;
determining, based on the reference image, a preliminary radio frequency (RF) field map corresponding to the ROI;
obtaining a transmitting field map corresponding to the ROI by performing a second scan on the ROI based on a second acquisition sequence; and
determining, based on the preliminary RF field map and the transmitting map, a sensitivity distribution of MR receiving coils corresponding to the ROI.

18. The method of claim 1, wherein in the reference image, an effect of at least one of a proton density, T1, or T2 of the at least two types of tissues of the ROI on contrast information of the reference image is weakened, and the effect of at least one of the proton density, T1, or T2 of the at least two types of tissues of the ROI on the contrast information of the reference image is less than an effect of the transmitting field non-uniformity and the receiving field non-uniformity on the contrast information of the reference image, wherein T1 is a time constant for regrowth of longitudinal magnetization, and T2 is a time constant for decay or dephasing of transverse magnetization.

19. The method of claim 1, wherein the sensitivity distribution includes a sensitivity distribution map, and the determining, based on the preliminary RF field map and the transmitting map, the sensitivity distribution of MR receiving coils corresponding to the ROI includes:

obtaining the sensitivity distribution map of the MR receiving coil by performing a differential process on the preliminary RF field map and the transmitting field map.

20. The method of claim 1, wherein when the reference image is an image with weakened tissue structure, high-frequency information and/or medium-high frequency information in the reference image corresponds to the weakened tissue structure, low-frequency information in the reference image corresponds to the combination of the transmitting field non-uniformity and the receiving field non-uniformity corresponding to the ROI, and the preliminary RF field map is determined by extracting the low-frequency information of the reference image or filtering out the high-frequency information and/or the medium-high frequency information of the reference image.

* * * * *